US 6,648,211 B2

(12) United States Patent
Saiki et al.

(10) Patent No.: US 6,648,211 B2
(45) Date of Patent: *Nov. 18, 2003

(54) PIN STANDING RESIN-MADE SUBSTRATE, METHOD OF MAKING PIN STANDING RESIN-MADE SUBSTRATE, PIN AND METHOD OF MAKING PIN

(75) Inventors: Hajime Saiki, Aichi (JP); Noritaka Miyamoto, Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/917,903

(22) Filed: Jul. 31, 2001

(65) Prior Publication Data

US 2002/0088844 A1 Jul. 11, 2002

(30) Foreign Application Priority Data

Oct. 13, 2000 (JP) ........................................ 2000-313769
Jan. 18, 2001 (JP) ........................................ 2001-009809
Apr. 10, 2001 (JP) ........................................ 2001-111881

(51) Int. Cl.$^7$ ........................ B23K 31/02; B23K 31/00; B32B 15/20; H01R 12/04
(52) U.S. Cl. ........................ 228/180.1; 228/180.21; 228/246; 428/671; 257/697; 174/260; 174/267
(58) Field of Search .................... 228/248.1, 179.1, 228/180.1, 246, 180.21; 257/697; 357/67–69; 29/830, 837; 174/267, 260; 428/544, 671

(56) References Cited

U.S. PATENT DOCUMENTS 4,598,470 A * 7/1986 Dougherty et al. ......... 174/262
4,634,638 A * 1/1987 Ainslie et al. ............... 428/671
4,709,468 A * 12/1987 Wilson ....................... 257/666
4,970,570 A * 11/1990 Agarwala et al. ........... 257/735
6,359,332 B2 * 3/2002 Shiraishi ..................... 257/697
6,376,782 B1 * 4/2002 Kimura et al. .............. 174/260
2002/0004324 A1 * 1/2002 Saiki et al. .................... 439/83
2002/0096361 A1 * 7/2002 Saiki et al. .................. 174/267

FOREIGN PATENT DOCUMENTS

| JP | 54-80255 A | * 6/1979 |
| JP | 63-272061 | 11/1988 |
| JP | 6-21312 | 1/1994 |
| JP | 2000-49252 | 2/2000 |
| JP | 2000-164786 | 6/2000 |
| JP | 2000-223184 | 8/2000 |

* cited by examiner

*Primary Examiner*—Tom Dunn
*Assistant Examiner*—L. Edmondson
(74) *Attorney, Agent, or Firm*—Sughrue Mion, PLLC

(57) ABSTRACT

A pin standing resin substrate including a resin substrate having a substantially plate-shaped main surface and composed of one of a resin and a composite material containing a resin, and having a pin-pad exposed from the main surface; and a pin soldered to the pin-pad, wherein the pin has been thermally treated by heating so as to soften the pin. The pin has a rod-like portion composed of a copper base metal and an enlarged diameter portion made of the same material as the rod-like portion. The enlarged diameter portion has a larger diameter than the rod-like portion and is formed at one end of the rod-like portion. At least the enlarged diameter portion is soldered to the pin-pad. Also disclosed is a method of making the pin standing resin substrate, a pin for bonding with the resin substrate, and a method of making the pin.

31 Claims, 12 Drawing Sheets

PIN STANDING RESIN-MADE SUBSTRATE, METHOD OF MAKING PIN STANDING RESIN-MADE SUBSTRATE, PIN AND METHOD OF MAKING PIN

BACKGROUND OF THE INVENTION

1. Field of the Invention

The present invention relates to a pin standing (pin grid array) resin substrate having pins as input/output terminals erected thereon, a method of making the pin standing resin substrate, a pin as an input/output terminal for use in the pin standing substrate, and a method of making the pin, and more particularly to a pin standing resin substrate having increased bonding strength between the pin and the resin substrate, a making method of the pin standing resin substrate, a pin capable of increasing the bonding strength with the resin substrate, and a method of making the pin.

2. Description of the Related Art

Conventionally, a pin standing resin substrate has pins as input/output terminals standing on a resin substrate made of resin or a composite material containing resin.

For example, a pin standing resin substrate 201 is shown in a partly enlarged cross sectional view of FIG. 12. This pin standing resin substrate 201 is constituted by a resin substrate 203 having an almost (substantially) rectangular and substantially laminar (plate-like) shape and a number of pins 221 standing thereon.

The resin substrate 203 has a resin insulating layer 205 with a wiring layer (not shown) formed inside or on the surface, with a number of pin-pads 209 exposed from a solder resist layer 207 being formed on the side of a main surface 203A (upward in the figure).

On the other hand, pin 221 may be made of 194 alloy, for example, and comprises a rod-like portion 221A of substantially cylindrical shape and an enlarged diameter portion 221B like a substantial disk formed at one end on the side of the pin-pad 209. The pin 221 is fixed to the resin substrate 203 by bonding the whole of the enlarged diameter portion 221B and a part of the rod-like portion 221A on the side of the enlarged diameter portion 221B with the pin-pad 209 by solder HD. The pin 221 may be made of copper base metal such as pure copper, phosphor bronze, german silver and beryllium bronze, or iron base metal such as kovar (Fe—Ni—Co alloy) and 42 alloy (Ni(42 wt %)—Fe alloy), as well as 194 alloy.

However, such pin standing resin substrate 201 may be broken in a junction part between the pin 221 and the pin-pad 209 when stress is applied to the pin 221, because the bonding strength between the pin 221 and the pin-pad 209 is weak. Or such pin standing substrate 201 may be broken because the pin-pad 209 or a portion around it may be peeled from the substrate.

SUMMARY OF THE INVENTION

This invention has been achieved in the light of the above-mentioned problems of the prior art. It is therefore an object of the invention to provide a pin standing resin substrate unlikely to break in a junction part between a pin and a pin-pad or in a part around a pin pad due to stress applied to the pin, a making method of the pin standing resin substrate, a pin for use in the pin standing substrate, and a method of making the pin.

The above objectives have been achieved by providing a pin standing resin substrate comprising:

a resin substrate having a substantially plate-shaped main surface and comprising one of a resin and a composite material containing a resin, and having a pin-pad exposed from the main surface; and a pin soldered to the pin-pad, wherein the pin has been thermally treated so as to soften the pin prior to soldering to the pin-pad, and comprises a rod-like portion made of a copper base metal and an enlarged diameter portion made of the same material as the rod-like portion, the enlarged diameter portion having a larger diameter than the rod-like portion and being formed at one end of the rod-like portion, and at least the enlarged diameter portion is soldered to the pin-pad.

The above objectives have also been achieved providing a method of making a pin standing resin substrate, which comprises:

thermally treating a pin by heating at a temperature of 500° C. or higher so as to soften the pin, wherein the pin comprises a rod-like portion comprising copper base metal and an enlarged diameter portion made of the same material as the rod-like portion, the enlarged diameter portion having a larger diameter than the rod-like portion, the enlarged diameter portion having a larger diameter than the rod-like portion and being formed at one end of the rod-like portion; and soldering at least the enlarged diameter portion of the pin to a pin-pad so as to fix the pin with a resin substrate, wherein the resin substrate has a substantially plate-shaped main surface and comprises one of a resin and a composite material containing a resin, the pin-pad being exposed from the main surface.

The above objectives have also been achieved by providing a method of making a pin standing resin substrate, which comprises:

reducing the Vickers hardness (Hv) of a pin to 135 or less, wherein the pin comprises a rod-like portion and an enlarged diameter portion made of the same material comprising one of pure copper and 194 alloy, the enlarged diameter portion having a larger diameter than the rod-like portion and being formed at one end of the rod-like portion; and soldering at least the enlarged diameter portion of the pin to a pin-pad so as to fix the pin with a resin substrate, wherein the resin substrate has a substantially plate-shaped main surface and comprises one of a resin and a composite material containing a resin, the pin-pad being exposed from the main surface.

The above objectives have further been achieved by providing a method of making a pin standing resin substrate, which comprises: soldering a pin-pad with at least an enlarged diameter portion of a pin, so as to fix the pin to a resin substrate, wherein the resin substrate has a substantially plate-shaped main surface and comprises one of a resin and a composite material containing a resin, the pin-pad being exposed from the main surface, the pin having a Vickers hardness (Hv) of 135 or less, and the pin comprising a rod-like portion and an enlarged diameter portion made of the same material comprising one of pure copper and 194 alloy, the enlarged diameter portion having a larger diameter than the rod-like portion and being formed at one end of the rod-like portion.

The above objectives have further been achieved by providing a method of making a pin for use in a pin standing substrate having at least one pin as an input/output terminal standing thereon, which comprises:

thermally treating the pin by heating at a temperature of 500° C. or higher so as to soften the pin, wherein the pin comprises a rod-like portion comprising copper base metal and an enlarged diameter portion made of the same material as the rod-like portion, the enlarged diameter portion having a larger diameter than the rod-like portion and being formed at one end of the rod-like portion.

The above objectives have further been achieved by providing a pin for use in a pin standing substrate having at least one pin as an input/output terminal standing thereon, which comprises:

a rod-like portion comprising copper base metal; and an enlarged diameter portion made of the same material as the rod-like portion, the enlarged diameter portion having a larger diameter than the rod-like portion and being formed at one end of the rod-like portion, wherein the pin has been thermally treated by heating at 500° C. or higher so as to soften the pin.

BRIEF DESCRIPTION OF THE DRAWINGS

FIGS. 2(a) and 2(b) each is a view illustrating a method for making the pin according to embodiment 1, wherein FIG. 2(a) is an explanatory view illustrating how a wire rod is sandwiched by the press dies, and FIG. 2(b) is an explanatory view illustrating how the wire rod is pressed to partly form an enlarged diameter portion partly.

FIGS. 3(a) and 3(b) each is a view illustrating a method for making the pin according to embodiment 1, wherein FIG. 3(a) is an explanatory view illustrating how the wire rod having a partly formed enlarged diameter portion is sandwiched again by the press dies, and FIG. 3(b) is an explanatory view illustrating how the wire rod is pressed to form the enlarged diameter portion.

FIGS. 5(a) and 5(b) each is a view illustrating a pin standing resin substrate according to embodiment 1, wherein FIG. 5(a) is a side view and FIG. 5(b) is a partially enlarged cross-sectional view.

FIGS. 6(a) and 6(b) each is a view illustrating a method for making the pin standing resin substrate according to embodiment 1, wherein FIG. 6(a) is an explanatory view illustrating how the soldering paste is applied on the pin-pads of a resin substrate, FIG. 6(b) is an explanatory view illustrating how the resin substrate is superposed on a pinning jig to contact the enlarged diameter portion of the pin with the soldering paste, and FIG. 6(c) is an explanatory view illustrating how the soldering paste is reflowed to solder the pin with the pin-pad.

FIGS. 7(a) and 7(b) each is a view illustrating a pin standing resin substrate according to embodiment 2, wherein FIG. 7(a) is a side view and FIG. 7(b) is a partially enlarged cross-sectional view.

FIGS. 10(a) and 10(b) each is a view illustrating a pin standing resin substrate according to embodiment 3, wherein FIG. 10(a) is a side view and FIG. 10(b) is a partially enlarged cross-sectional view.

FIGS. 11(a) to 11(c) each is an explanatory view showing a pin fixing step in the method for making the pin standing resin substrate according to embodiment 3, wherein FIG. 11(a) is a view illustrating a state where the soldering paste is applied on the pin-pad of the resin substrate, FIG. 11(b) is a view illustrating a state where the resin substrate is superposed on a pinning jig to contact the enlarged diameter portion of the pin with the soldering paste, and FIG. 11(c) is a view illustrating a state where the solder is reflowed to solder the pin on the pin-pad.

Figure 1:
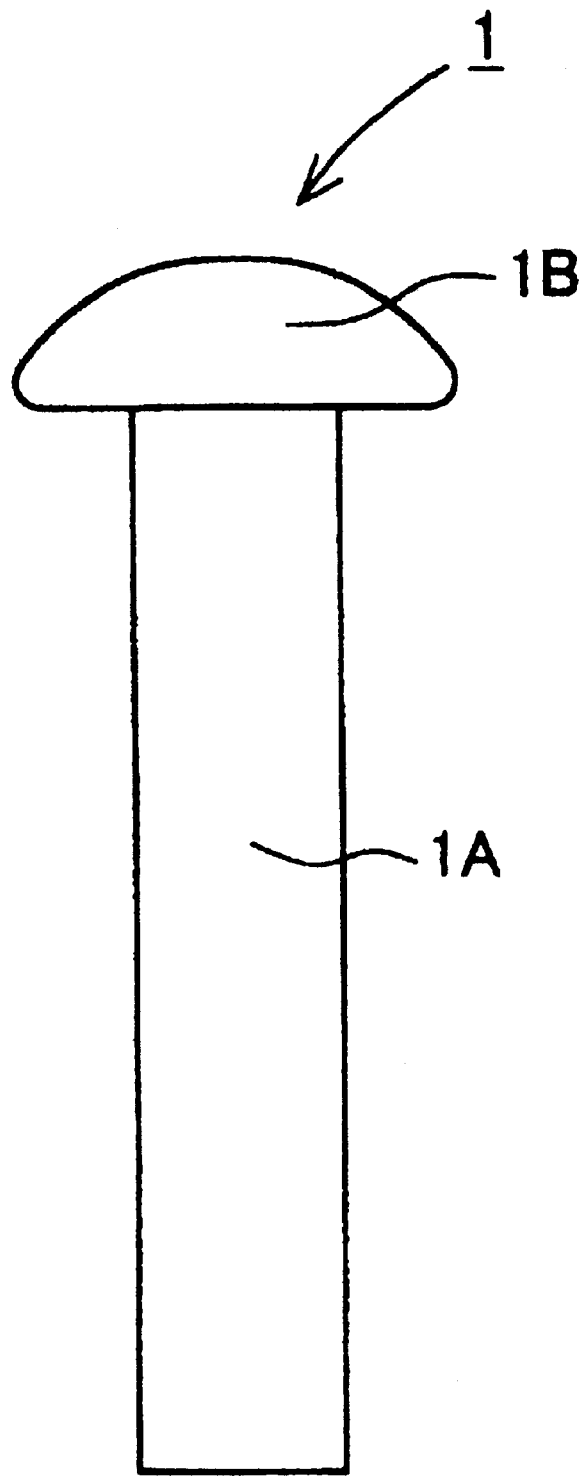
FIG. 1 is an overall view of a pin according to an embodiment 1.

Description of Reference Numerals 1, 301: pin
1A, 301A: rod-like portion
1B, 301B: enlarged diameter portion
11, 111, 311: pin standing resin substrate
13, 113, 313: resin substrate
13A, 113A, 313A: main surface (of resin substrate)
17AP, 117AP, 317AP: pin-pad
121, 321: concave portion
HD: solder

DETAILED DESCRIPTION OF THE INVENTION

According to one aspect, the invention provides a pin standing resin substrate comprising:

a resin substrate having a substantially laminar plate-shaped main surface comprising one of a resin and a composite material containing a resin, and having a pin-pad exposed from the main surface; and a pin soldered to the pin-pad, wherein the pin has been thermally treated and softened prior to soldering to the pin-pad, and comprises a rod-like portion made of a copper base metal and an enlarged diameter portion made of the same material as the rod-like portion, the enlarged diameter portion having a larger diameter than the rod-like portion and being formed at one end of the rod-like portion, and at least the enlarged diameter portion is soldered to the pin-pad.

The pin is typically obtained by forming a wire rod in a predetermined shape, but may be hardened due to work distortion because a raw material is drawn to make the wire rod of a predetermined diameter. Also, it may be hardened by working the enlarged diameter portion. Therefore, the pin is considered to be harder than the raw material itself.

On the contrary, according to this aspect of the invention, the pin is softened by subjecting it to thermal heat treatment. Therefore, when stress is applied to the pin, the pin itself is deformed to absorb the stress, so that stress applied to a junction part between the pin and the resin substrate or the resin substrate itself can be relieved.

Accordingly, this pin standing resin substrate is unlikely to break down in a junction part between a pin and a pin-pad or in a part around a pin pad when stress is applied to the pin, and is highly reliable.

In a pin tensile test there are three breakage modes of a pin standing resin substrate, namely, "pin breakage mode", "solder breakage mode" and "substrate breakage mode". "Pin breakage mode" is where the pin is cut away in the rod-like portion of the pin. "Solder breakage mode" means breakage at the junction part between a pin and a pin-pad, e.g., between a pin and a solder joint, solder, or between a pin pad and a joint solder. "Substrate breakage mode" means breakage between a pin pad and a surface of the substrate.

In these modes, "solder breakage mode" is undesirable because it means lack of strength in the junction part between a pin and a pin pad. "Substrate breakage mode" is also undesirable because the resin substrate itself breaks. Therefore, in the pin tensile test, "pin breakage mode" may be encountered where the pin is jointed strong enough to the pad portion and the resin substrate itself does not break.

According to this aspect of the invention, the pin standing resin substrate is unlikely to break down in a junction part between a pin and a pin-pad or in a part around a pin pad, because a softened pin can absorb stress applied thereto, and meets the above requirements.

In a pin standing ceramic substrate having pins standing on the ceramic substrate, conventionally the pins are thermally treated at high temperature. This is because the pins are normally brazed to the ceramic substrate and subjected to a high temperature, for example, of about 800° C. in brazing.

On the contrary, in a pin standing resin substrate, the pins are soldered at a temperature as low as 200 to 300° C. in view of the low heat resistance of the resin substrate, and the pins are not subjected to particularly high temperatures in the soldering step. Consequently, the pins are harder and cannot absorb much stress.

However, in this aspect of the invention, as described above, the pins are thermally treated and softened at a higher temperature than the soldering temperature before soldering, so that stress applied to the pin is more likely to be absorbed, and the pin standing resin substrate is unlikely to break down in a junction part between a pin and a pin pad.

The pin material may be any copper base metal, so long as the rod-like portion and the enlarged diameter portion are made of the same material, and may include copper base metals such as pure copper (oxygen free copper), 194 alloy (copper alloy), phosphor bronze, german silver and brass, which are comparatively softer than iron base metals.

Further, according to another aspect, the invention, provides a pin standing resin substrate comprising:

a resin substrate having a substantially laminar plate-shaped main surface comprising one of a resin and a composite material containing a resin, and having a pin-pad exposed from the main surface; and a pin soldered to the pin-pad, wherein the pin has been thermally treated by heating at a temperature 500° C. or higher prior to soldering to the pin-pad, and comprises a rod-like portion and an enlarged diameter portion made of the same material as the rod-like portion, the enlarged diameter portion having a larger diameter than the rod-like portion and being formed at one end of the rod-like portion, and at least the enlarged diameter portion is soldered to the pin-pad.

The pin may be typically harder, due to work distortion caused during the shaping, than the raw material itself.

On the contrary, according to this aspect of the invention, the pin is thermally heat treated at a temperature of 500° C. or higher. Therefore, when stress is applied to the pin, the pin itself is deformed to absorb the stress, so that the stress applied to a junction part between the pin and the resin substrate or the resin substrate itself can be relieved.

Accordingly, this pin standing resin substrate is unlikely to break down in a junction part between a pin and a pin-pad or in a part around a pin pad when stress is applied to the pin, and is highly reliable.

According to a further aspect, the invention provides a pin standing resin substrate comprising:

a resin substrate having a substantially laminar plate-shaped main surface comprising one of a resin and a composite material containing a resin, and having a pin-pad exposed from the main surface; and a pin soldered to the pin-pad, wherein the pin has been thermally treated by heating at a temperature of 500° C. to 900° C. prior to soldering to the pin-pad, and comprises a rod-like portion made of a copper base metal and an enlarged diameter portion made of the same material as the rod-like portion, the enlarged diameter portion having a larger diameter than the rod-like portion and being formed at one end of the rod-like portion, and at least the enlarged diameter portion is soldered to the pin-pad.

According to this aspect of the invention, the pin is made softer due to thermal heat treatment at a temperature of from 500° C. to 900° C. Therefore, when a stress is applied on the pin, the pin itself is deformed to absorb the stress, so that stress applied to a junction part between the pin and the pin pad or on the part around the pin pad can be relieved.

Accordingly, this pin standing resin substrate is unlikely to break down in a junction part between the pin and the pin pad or in the part around the pin pad when the stress is applied to the pin, and is highly reliable.

The thermal treatment of a pin made of a copper base metal may be appropriately chosen in a temperature range lower than the melting point. However, if the pin is heated to too high a temperature, the heating cost may be excessive, and it is preferable to heat the pin to a temperature of 900° C. or less. On the other hand, in a pin standing ceramic substrate having pins standing on the ceramic substrate, conventionally the pins are thermally treated at a high temperature. This is due to the fact that the pins are normally brazed to the ceramic substrate and subjected to high temperatures in brazing.

On the contrary, in the pin standing resin substrate, the pins are soldered at a temperature as low as about 200° C. in view of the low heat resistance of the resin substrate, and the pins are not subjected to particularly high temperatures in the soldering step. Consequently, the pins are harder and cannot absorb much stress.

However, in this aspect of the invention, as described above, the pins are thermally treated at a high temperature and softened before the pins are solder-jointed to the pin-pads, so that stress applied to the pin is more likely to be absorbed, and the pin standing resin substrate is unlikely to break down.

The pin material may be any copper base metal, so long as the rod-like portion and the enlarged diameter portion are made of the same material, but may include a copper base metal such as pure copper (oxygen free copper), 194 alloy (copper alloy), phosphor bronze, german silver and brass, which are comparatively softer than iron base metals.

According to another aspect the invention, provides a pin standing resin substrate comprising:

a resin substrate having a substantially laminar plate-shaped main surface comprising one of a resin and a composite material containing a resin, and having a pin-pad exposed from the main surface; and a pin soldered to the pin-pad, wherein the pin has been thermally treated by heating at a temperature of 550° C. or higher prior to soldering to the pin-pad, and comprises a rod-like portion made of a copper base metal and an enlarged diameter portion made of the same material as the rod-like portion, the enlarged portion having a larger diameter than the rod-like portion and being formed at one end of the rod-like portion, and at least the enlarged diameter portion is soldered to the pin-pad.

The pin made of a copper base metal may be harder, due to work distortion caused during the shaping, than the raw material itself.

On the contrary, according to yet another aspect of the invention, the pin made of a copper base metal is thermally heat treated at a temperature of 700° C. or higher. Hence, the pin is softened securely and sufficiently prior to soldering to the pin-pad. Therefore, when stress is applied to the pin made of a copper base material, the pin itself is deformed to absorb the stress. As a result, the stress applied to a junction part between the pin and the pin pad or the part around the pin pad on the surface of the resin substrate can be relieved.

Accordingly, this pin standing resin substrate is unlikely to break down in a junction part between the pin and the pin pad or in the part around the pin pad on the surface of the resin substrate when stress is applied to the junction part between the pin and the pin pad, and is highly reliable.

In particular, when heated at a temperature of 550° C. or higher, the pin has a fully higher tensile strength, resulting in particularly high connection reliability.

The thermal treatment of a pin made of a copper base material may be appropriately chosen in a range of temperatures lower than the melting point. However, if the pin is heated to too high a temperature, the heating cost may be excessive, and it is preferable to heat the pin at a temperature of 900° C. or less.

The material of the pin may be any copper base metal, so long as the rod-like portion and the enlarged diameter portion are made of the same material, but may include copper base metals such as pure copper (oxygen free copper), 194 alloy (copper alloy), phosphor bronze, german silver and brass, which are comparatively softer than iron base metals.

According to another aspect, the invention provides a pin standing resin substrate comprising:

a resin substrate having a substantially laminar plate-shaped main surface comprising one of a resin and a composite material containing resin, and having a pin-pad exposed from the main surface; and a pin soldered to the pin-pad, the pin comprises a rod-like portion made of a copper base metal and an enlarged diameter portion made of the same material as the rod-like portion, the enlarged diameter portion having a larger diameter than the rod-like portion and being formed at one end of the rod-like portion, the pin having a Vickers hardness Hv of 135 or less, and at least the enlarged diameter portion is soldered to the pin-pad.

As described above, the pin obtained by forming the wire rod in a predetermined shape may be hardened due to work distortion caused by fabricating from a raw material of a copper base metal a wire rod of a predetermined diameter, or by working to form the enlarged diameter portion. Such a hardened pin, when fixed to the resin substrate by soldering, is not easily deformed due to stress applied to the pin, and is more likely to break down between the pin and the pin pad.

On the contrary, according to this aspect of the invention, the pin made of a copper base metal is soft having a Vickers hardness Hv of 135 or less. Therefore, when stress is applied to the pin, the pin itself is deformed to absorb the stress, so that stress applied to a junction part between the pin and pin pad on the resin substrate or the part around the pin pad on the resin substrate can be relieved.

Accordingly, this pin standing resin substrate is unlikely to break down in a junction part between the pin and pin pad on the resin substrate or in the part around the pin pad on the resin substrate when stress is applied to the pin, and is highly reliable.

A Vickers hardness Hv of 135 or less may be imparted to the pin by various methods, such as by casting the pin so as not to harden the pin, heating the pin after forming the pin normally using a press or the like, heating in a high frequency electromagnetic field, heating the pin by laser beams, and heating the pin in a furnace having a heater by radiation heat.

The Vickers hardness Hv of the softened pin made of a copper base metal is preferably 95 or less. When stress is applied to the pin having a Vickers hardness Hv of 95 or less, the pin itself is deformed to better absorb the stress, and is highly reliable.

The pin material may be any copper base metal, so long as the rod-like portion and the enlarged diameter portion are made of the same material, and may include a copper base metal such as pure copper (oxygen free copper), 194 alloy (copper alloy), phosphor bronze, german silver and brass, which are comparatively softer than iron base metals. Pure copper (oxygen free copper) and 194 alloy (copper alloy) are especially preferred as the copper base metal.

Also, in the pin standing resin substrate, the pin may be thermally treated to reduce its Vickers hardness.

In this aspect of the invention, the pin is thermally treated to reduce the Vickers hardness. The pin is produced through an ordinary process and the Vickers hardness is reduced by thermal treatment at a later stage. Hence, a pin that is easy to produce and readily available can be employed, resulting in an inexpensive pin standing resin substrate.

Further, in the pin standing resin substrate, the pin is preferably passed through a belt furnace to carry out thermal treatment. By carrying out thermal treatment within a belt furnace, the whole of the pin can be thermally treated uniformly and securely, and processed inexpensively, resulting in inexpensive pin standing resin substrates.

The solder used for soldering the pin may be appropriately selected in consideration of the heat resistance of the pin standing resin substrate and the soldering temperature in mounting electronic parts such as IC chips on the pin standing resin substrate. For example, Sn/Sb base solder, Pb/Sn base solder, Sn/Ag base solder, Pb base solder, and Pb/Sn/Sb may be used. These solders may contain Cu, Ag, Bi, Au, Pb, In, Al and As as additives.

Accordingly, the pin standing resin substrate as described above preferably uses any one of Sn/Sb base solder (95Sn—5Sb solder), Pb/Sn base solder (37Pb—73Sn eutectic solder, 50Pb—50Sn solder, 82Pb—10Sn—8Sb solder, among others) and the Sn/Ag base solder (96.5Sn—3.5Ag solder, among others).

However, in the case where the pin surface is plated with Au, to improve solder wettability with respect to the Au plating layer on the pin surface, the creep height of the solder tends to be difficult to control. Accordingly, in terms of control of solder creep height, a solder having a relatively low wettability with respect to an Au plating layer is preferred. Specially, Sn—Sb and Pb—Sn—Sb type solders are preferred. Sn—Sb and Pb—Sn—Sb type solders having an Sb content of 3 wt % to 15 wt % are particularly preferred. Examples of such a preferred solder include 95Sn—5Sb and 82Sb—10Sn—8Sb solders. By employing an Sb content of not less than 3 wt %, a reduction in wettability of the solder is apparent, thereby facilitating control of the creep height of a solder metal. In order to prevent excessive reduction in wettability of the solder, the Sb content is preferably not greater than 15 wt %. When the thickness of the Au plating layer on the pin surface is not less than 0.04 μm, the creep height and the creep speed of a solder tend to increase. Thus, control of the creep height of a solder by selecting the composition of solder becomes particularly important.

In the pin standing resin substrate, the pin is preferably mechanically polished prior to thermal treatment.

At the time when a pin is produced by a press, the pin may have burrs in various parts, or a sharp corner edge may be formed. Such burrs or sharp corner edges are easily exfoliated, and become a metal powder which sticks to various parts of the substrate or other electronic parts, bringing about a danger of causing a short-circuit or insulation failure. Hence, burrs are removed by mechanical polishing such as barrel polishing, or the sharp corner edge is beveled. Such mechanical polishing may be performed before or after thermal treatment of the pin. However, if such mechanical polishing is performed, the pin surface may be hardened due to collision of the media or abrasive grains with the surface of pin. Accordingly, if the pin is mechanically polished after thermal treatment to soften the pin, the pin once softened is unfavorably hardened again.

On the contrary, if the pin is mechanically polished prior to thermal treatment, the pin can be softened by the thermal treatment although the pin may be hardened by mechanical polishing, whereby it is possible to eliminate any influence of the mechanical polishing.

The mechanical polishing may be effected by barrel polishing, sand blasting, shot blasting, water jetting with a polishing powder, hydro-honing, or brushing with an abrasive material. Among them, barrel polishing is preferable as the mechanical polishing. With barrel polishing, a large quantity of pins can be processed at one time and inexpensively, and uniformly in removing burrs or beveling.

In the pin standing resin substrate, the enlarged diameter portion of the pin contains a spherical surface opposite the rod-like portion.

According to this aspect of the invention, the enlarged diameter portion of the pin contains a spherical surface opposite the side of the rod-like portion, whereby the pin and the pin-pad are soldered in a state where the spherical face of the enlarged diameter portion is directed to the pin-pad.

Therefore, the enlarged diameter portion can carry a larger amount of solder between the enlarged diameter portion of the pin and the pin-pad as compared to a nail-headed pin, resulting in increased bonding strength.

Since the enlarged diameter portion has a spherical face, the stress applied to the pin may be absorbed over the entire junction part, without being concentrated at a specific point. Accordingly, the stress applied to the pin itself or to the resin substrate main body can be relieved.

Further, since the pin is thermally treated and softened, the pin itself can absorb stress by deforming when stress is applied to the pin. Hence, the stress applied to the junction part between the pin and the resin substrate, or to the resin substrate main body can be relieved.

Accordingly, this pin standing resin substrate is unlikely to break down in a junction part between the pin and pin pad on the resin substrate or in the part around the pin pad on the resin substrate when subjected to stress, and is highly reliable, due to a synergetic effect thereof.

Further, in the pin standing resin substrate, the main surface has a concave portion having a bottom portion at least on which the pin-pad is exposed, and at least the enlarged diameter portion of the pin is received within the concave portion and at least a part of the rod-like portion projects from the main surface.

To increase the bonding strength between the pin and the resin substrate, it is preferable to increase the height (axial length) of the enlarged diameter portion and secure a larger amount of solder to bond the pin and the pin-pad. However, if the height of the enlarged diameter portion is increased, the pin, when inserted into a socket, results in a greater gap between the pin standing resin substrate and the socket due to the enlarged diameter portion.

On the contrary, the pin standing resin substrate of this aspect of the invention has a concave portion on the main surface of which the pin-pad is exposed at least on the bottom face, and the enlarged diameter portion of the pin is received within the concave portion. Accordingly, irrespective of the enlarged diameter portion of the pin being formed, when the pin is inserted into the socket, the gap between the pin standing resin substrate and the socket can be reduced.

According to another aspect, the invention provides a method for making a pin standing resin substrate comprising:

a pin thermal treatment step of thermally treating and softening a pin having a rod-like portion made of a copper base metal and an enlarged diameter portion made of the same material as the rod-like portion, the enlarged portion having a larger diameter than the rod-like portion and being formed at one end of the rod-like portion; and a pin fixing step of soldering a pin-pad with at least the enlarged diameter portion of the pin to a pin-pad so as to fix the pin with a resin substrate, wherein the resin substrate has a a substantially laminar plate-shaped main surface and comprises one of a resin or a composite material containing a resin, the pin-pad being exposed from the main surface.

According to this aspect of the invention, in the pin thermal treatment step, the pin is thermally treated by heating and softened. In the pin fixing step, the softened pin is soldered to the pin-pad of the resin substrate.

Accordingly, for the pin standing wiring substrate thus produced, when stress is applied to the pin, the pin itself is likely to absorb the stress. Hence, the stress applied to the junction part between the pin and the pin pad on the resin substrate or to the portion around the pin pad on the resin substrate can be relieved. Therefore, with this method of making, a pin standing resin substrate can be produced in which the pin is unlikely to break down in a junction part between the pin and pin pad on the resin substrate or in the part around the pin pad on the resin substrate when subjected to stress.

According to a further aspect, the invention provides a method for making a pin standing resin substrate comprising:

a pin thermal treatment step of thermally treating a pin by heating at a temperature of 500° C. or higher, the pin having a rod-like portion made of a copper base metal and an enlarged diameter portion made of the same material as the rod-like portion, the enlarged diameter portion having a larger diameter than the rod-like portion and being formed at one end of the rod-like portion; and a pin fixing step of soldering at least the enlarged diameter portion of the pin to a pin-pad so as to fix the pin with a resin substrate, wherein the resin substrate has a substantially laminar plate-shaped main surface and comprises one of a resin and a composite material containing a resin, the pin-pad being exposed from the main surface.

According to this aspect of the invention, in the pin thermal treatment step, the pin is thermally treated by heating at 500° C. or higher, and thus softened. In the pin fixing step, the softened pin is soldered to the pin-pad of the resin substrate.

Accordingly, in the pin standing wiring substrate thus produced, when stress is applied to the pin, the pin itself is likely to absorb the stress. Hence, the stress applied to the junction part between the pin and the resin substrate or to the resin substrate itself can be relieved. Therefore, with this method of making, a pin standing resin substrate can be produced in which the resin substrate itself (e.g., a junction part between a pin and a pin pad, a part around the pin pad) is unlikely to break down in a junction part between the pin and pin pad on the resin substrate or in the part around the pin pad on the resin substrate when subjected to stress.

According to another aspect, the invention provides a method for making a pin standing resin substrate comprising:

a pin thermal treatment step of thermally treating a pin by heating at a temperature of from 500° C. to 900° C., the pin having a rod-like portion made of a copper base metal and an enlarged diameter portion made of the same material as the rod-like portion, the enlarged diameter portion having a larger diameter than the rod-like portion and being formed at one end of the rod-like portion; and a pin fixing step of soldering at least the enlarged diameter portion of the pin to a pin-pad, so as to fix the pin with a resin substrate, wherein the resin substrate has a substantially laminar plate-shaped main surface and comprises one of a resin and a composite material containing a resin, the pin-pad being exposed from the main surface.

According to this aspect of the invention, in the pin thermal treatment step, the pin is thermally treated by heating at a temperature from 500° C. to 900° C., and thus softened. In the pin fixing step, the softened pin is soldered to the pin-pad of the resin substrate.

Accordingly, in the pin standing wiring substrate thus produced, when stress is applied to the pin, the pin itself is likely to absorb the stress. Hence, the stress applied to the junction part between the pin and the resin substrate or to the resin substrate itself can be relieved. Therefore, with this method of making, a pin standing resin substrate can be produced in which the pin is unlikely to break down in a junction part between the pin and pin pad on the resin substrate or in the part around the pin pad on the resin substrate when subjected to stress.

The thermal treatment of a pin made of a copper base metal may be appropriately selected in a range of temperatures lower than the melting point. However, if the pin is heated to too high a temperature, the heating cost may be excessive, and it is preferable to heat the pin at a temperature of 900° C. or lower. Furthermore, in order to sufficiently soften a pin, it is preferable to heat the pin at a temperature of 550° C. or higher.

According to another aspect, the invention provides a method for making a pin standing resin substrate comprising:

a pin thermal treatment step of thermally treating a pin by heating at a temperature of 550° C. or higher, the pin having a rod-like portion made of a copper base metal and an enlarged diameter portion made of the same material as the rod-like portion, the enlarged diameter portion having a larger diameter than the rod-like portion and being formed at one end of the rod-like portion; and a pin fixing step of soldering at least the enlarged diameter portion of the pin to a pin-pad, so as to fix the pin with a resin substrate, wherein the resin substrate has a substantially laminar plate-shaped main surface and comprises one of a resin and a composite material containing a resin, the pin-pad being exposed from the main surface.

According to this aspect of the invention, in the pin thermal treatment step, the pin made of a copper base metal is thermally treated by heating at a temperature of 550° C. or higher, and thus softened securely and fully. In the pin fixing step, the softened pin is soldered to the pin-pad of the resin substrate.

Accordingly, in the pin standing wiring substrate thus produced, when a stress is applied to the pin, the pin itself is likely to absorb the stress. Hence, the stress applied to the junction part between the pin and the resin substrate or to the resin substrate itself can be relieved. Therefore, with this method of making, a pin standing resin substrate can be produced in which the pin is unlikely to break down in a junction part between the pin and pin pad on the resin substrate or in the part around the pin pad on the resin substrate when subjected to stress.

The thermal treatment of a copper base metal may be appropriately chosen in a range of temperatures lower than those melting points. However, if the pin is heated to too high a temperature, the heating cost may be excessive, and it is preferable to heat the pin at a temperature of 900° C. or less.

According to a further aspect, the invention provides a method for making a pin standing resin substrate comprising:

a pin hardness reducing step of reducing the Vickers hardness of a pin to 135 or less, the pin having a rod-like portion made of a copper base metal and an enlarged diameter portion made of the same material as the rod-like portion, the enlarged diameter portion having a larger diameter than the rod-like portion and being formed at one end of the rod-like portion; and a pin fixing step of soldering at least the enlarged diameter portion of the pin to a pin-pad, so as to fix the pin with a resin substrate, wherein the resin substrate has a substantially laminar plate-shaped main surface and comprises one of a resin and a composite material containing a resin, the pin-pad being exposed from the main surface.

According to this aspect of the invention, the pin is made of a copper base metal, and in the pin hardness reducing step, the Vickers hardness Hv of the pin is reduced to 135 or less. In the pin fixing step, the pin softened with reduced hardness is soldered to the pin-pad of the resin substrate.

Accordingly, in the pin standing wiring substrate thus produced, when stress is applied to the pin, the pin itself is likely to absorb the stress. Hence, the stress applied to the junction part between the pin and the pin pad on the resin substrate or to the portion around the pin pad on the resin substrate itself can be relieved. In the pin hardness reducing step, the Vickers hardness Hv of the pin made of a copper base metal is reduced preferably to 95 or less. When stress is applied to the pin having a Vickers hardness Hv of 95 or less, the pin itself is deformed to absorb the stress more sufficiently, and is highly reliable. Furthermore, a pin having a Vickers hardness Hv of 60 or more is preferred. Therefore, with this method of making, a pin standing resin substrate can be produced in which the pin is unlikely to break down in a junction part between the pin and pin pad on the resin substrate or in the part around the pin pad on the resin substrate when subjected to stress.

The method for making the pin standing resin substrate may include a pin hardness reducing step that is also the pin thermal treatment step of thermally treating the pin by heating to reduce the Vickers hardness.

In the case where the Vickers hardness of the pin is reduced by thermal treatment, a number of pins can be easily treated under uniform conditions.

Further, in the method for making the pin standing resin substrate, the pin hardness reducing step preferably includes reducing the Vickers hardness due to thermal treatment of passing the pin through a belt furnace. Due to the thermal treatment through the belt furnace, the whole of the pin can be heated uniformly and securely to effect the thermal treatment, resulting in an inexpensive pin standing resin substrate.

Further, the method for making the pin standing resin substrate can further include a mechanical polishing step of mechanically polishing the pin prior to the pin thermal treatment step.

At the time when the pin is produced by a press, the pin may have burrs in various parts, or a sharp corner edge may be formed. Such burrs or sharp corner edges are easily exfoliated, and become a metal powder which sticks to various parts of the substrate or other electronic parts, bringing about a danger of causing a short-circuit or insulation failure. Hence, burrs are removed by mechanical polishing such as barrel polishing, or the sharp corner edge is beveled. Such mechanical polishing may be performed before or after thermal treatment of the pin.

However, if such mechanical polishing is performed, the pin surface may be hardened due to collision of the media or abrasive grains with the surface of the pin. Accordingly, if the pin is mechanically polished after thermal treatment to soften the pin, the pin once softened is unfavorably hardened again.

On the contrary, in this aspect of the invention the mechanical polishing step is carried out prior to the pin thermal treating step. Hence, the pin can be softened by thermal treatment although the pin may be hardened by mechanical polishing, whereby it is possible to eliminate any influence of the mechanical polishing and fix a softer pin.

The mechanical polishing step may be effected by barrel polishing, sand blasting, shot blasting, water jetting with a polishing powder, hydro-honing, or brushing with an abrasive material.

In particular, in the method for making the pin standing resin substrate, the mechanical polishing step is preferably barrel polishing.

In this aspect of the invention, barrel polishing is employed as the mechanical polishing step. With barrel polishing, a large quantity of pins can be processed at the same time and inexpensively, and uniformly in removing burrs or beveling.

According to a further aspect, the invention provides a method for making a pin standing resin substrate comprising:

a pin fixing step of soldering an enlarged diameter portion of a pin to a pin-pad so as to fix the pin with a resin substrate, wherein the resin substrate has a substantially laminar plate-shaped main surface and comprises one of a resin and a composite material containing a resin, the pin-pad being exposed from the main surface, the pin having a rod-like portion made of pure copper or 194 alloy and the enlarged diameter portion made of the same material as the rod-like portion, the enlarged diameter portion having a larger diameter than the rod-like portion and being formed at one end of the rod-like portion, and the pin having a Vickers hardness Hv of 135 or less.

In this aspect of the invention, the pin is made of pure copper or 194 alloy, and has a Vickers hardness Hv of 135 or less. Hence, the pin can relieve stress which is applied to the pin, and has a greater bonding strength between the fixed pin and the resin substrate. Therefore, the pin standing resin substrate has a higher reliability. In the pin hardness reducing step, the Vickers hardness Hv of the pin made of a copper base metal is reduced preferably to 95 or less. When stress is applied to a pin having a Vickers hardness Hv of 95 or less, the pin itself is deformed to absorb the stress more sufficiently, and is highly reliable. Furthermore, a pin having a Vickers hardness Hv of 60 or more is preferred.

In the method for making the pin standing resin substrate, the thermal treating step preferably includes thermally heat treating a pin having an enlarged diameter portion having a spherical surface opposite a rod-like portion.

In this aspect of the invention, in the pin fixing step, a pin having the enlarged diameter portion containing the spherical surface is soldered to the pin-pad. Hence, in the pin standing substrate thus produced, the pin is likely to absorb stress over the junction part when applied to the pin. Therefore, the stress applied to the pin or resin substrate main body can be relieved.

The pin having an enlarged diameter portion containing the spherical surface is fixed to the pin-pad, securing a quantity of solder between them, and increasing the bonding strength.

Further, since the pin is softened in the pin thermal treatment step, when stress is applied to the pin, the pin itself can also absorb the stress. Hence, the stress applied to the junction part between the pin and the resin substrate or the resin itself can be relieved.

Accordingly, due to their synergetic effect, with the method of making of this aspect of the invention, it is possible to produce a pin standing resin substrate that is unlikely to break down even though stress is applied to the junction part between the pin and the pin pad on the resin substrate or to the portion around the pin pad.

According to another aspect, the invention provides a pin for use in a pin standing substrate having at least one pin as an input/output terminal standing thereon, comprising:

a rod-like portion made of a copper base metal; and an enlarged diameter portion made of the same material as the rod-like portion, the enlarged diameter portion having a larger diameter than the rod-like portion and being formed at one end of the rod-like portion, wherein the pin has been thermally treated so as to soften the pin.

The pin of this aspect of the invention is softened as a result of thermal heat treatment, and is softer than a pin that has not been subjected to thermal treatment. Therefore, if a pin standing resin substrate including this pin is produced, the pin itself is prone to absorb stress, when stress is applied to the pin. As a result, the stress applied to a junction part between the pin and the pin pad or the part around the pin pad on the resin substrate itself can be relieved.

Accordingly, this pin standing resin substrate using the pin of this aspect of the invention is unlikely to break down in a junction part between the pin and pin pad on the resin substrate or in the part around the pin pad on the resin substrate when stress is applied to the pin, and is highly reliable.

According to a further aspect, the invention provides a pin for use in a pin standing substrate having at least one pin as an input/output terminal standing thereon, comprising:

a rod-like portion made of a copper base metal; and an enlarged diameter portion made of the same material as the rod-like portion, the enlarged diameter portion having a larger diameter than the rod-like portion and being formed at one end of the rod-like portion, wherein the pin has been subjected to thermal treatment by heating at a temperature of 500° C. or higher.

The pin of this aspect of the invention is softened as a result of thermal treatment by heating at a temperature of 600° C. or higher, and is softer than a pin that has not been subjected to thermal treatment. Therefore, if a pin standing resin substrate including this pin is produced, the pin itself is prone to absorb stress, when stress is applied to the pin. As a result, the stress applied to a junction part between the pin and the resin substrate or the resin substrate itself can be relieved.

Accordingly, this pin standing resin substrate using the pin of this aspect of the invention is unlikely to break down in a junction part between the pin and pin pad on the resin substrate or in the part around the pin pad on the resin substrate when stress is applied to the pin, and is highly reliable.

According to another aspect, the invention provides a pin for use in a pin standing substrate having at least one pin as an input/output terminal standing thereon, comprising:

a rod-like portion made of a copper base metal; and an enlarged diameter portion made of the same material as the rod-like portion, the enlarged diameter portion having a larger diameter than the rod-like portion and being formed at one end of the rod-like portion, wherein the pin has been subjected to thermal treatment by heating at a temperature of from 500° C. to 900° C.

The pin of this aspect of the invention is softened as a result of thermal treatment by heating at a temperature of from 500° C. to 900° C., and is softer than a pin that has not been subjected to thermal treatment. Therefore, if a pin standing resin substrate including this pin is produced, the pin itself is prone to absorb stress, when stress is applied to the pin. As a result, the stress applied to a junction part between the pin and the resin substrate or the resin substrate itself can be relieved.

Accordingly, this pin standing resin substrate including a pin of this aspect of the invention is unlikely to break down in a junction part between the pin and pin pad on the resin substrate or in the part around the pin pad on the resin substrate when stress is applied to the pin, and is highly reliable.

According to another aspect, the invention provides a pin for use in a pin standing substrate having at least one pin as an input/output terminal standing thereon, comprising:

a rod-like portion made of a copper base metal; and an enlarged diameter portion made of the same material as the rod-like portion, the larger diameter portion having a larger diameter than the rod-like portion and being formed at one end of the rod-like portion, wherein the pin has been thermally treated by heating at a temperature of 550° C. or higher.

The pin of this aspect of the invention is softened as a result of thermal treatment by heating at a temperature of 550° C. or higher, and is much softer than a pin made of copper base metal that has not been thermally treated. Therefore, if a pin standing resin substrate including this pin is produced, the pin itself is prone to absorb stress, when stress is applied to the pin. As a result, the stress applied to a junction part between the pin and the resin substrate or the resin substrate itself can be relieved.

Accordingly, this pin standing resin substrate using the pin of this aspect of the invention is unlikely to break down in a junction part between the pin and pin pad on the resin substrate or in the part around the pin pad on the resin substrate when stress is applied to the pin, and is highly reliable.

According to a further aspect, the invention provides a pin for use in a pin standing substrate having at least one pin as input/output terminal standing thereon, comprising:

a rod-like portion made of a copper base metal; and an enlarged diameter portion made of the same material as the rod-like portion, the enlarged diameter portion having a larger diameter than the rod-like portion and being formed at one end of the rod-like portion, wherein the pin has a Vickers hardness of 135 or less.

The pin of this aspect of the invention is made of kovar or 42 alloy, but is soft having a Vickers hardness of 135 or less. Therefore, if the pin standing resin substrate including this soldered pin is produced, the pin itself is prone to absorb stress, when stress is applied to the pin. As a result, the stress applied to a junction part between the pin and the resin substrate or the resin substrate itself can be relieved.

Accordingly, this pin standing resin substrate using the pin of this aspect of the invention is unlikely to break down in a junction part between the pin and pin pad on the resin substrate or in the part around the pin pad on the resin substrate when stress is applied to the pin, and is highly reliable.

The Vickers hardness Hv of the pin made of a copper base metal is reduced preferably to 95 or less in a pin hardness reducing step. When stress is applied to a pin having a Vickers hardness Hv of 95 or less, the pin itself is deformed to absorb the stress more sufficiently, and is highly reliable. Furthermore, a pin having a Vickers hardness Hv of 60 or more is preferred.

The material of the pin may be any copper base metal, so long as the rod-like portion and the enlarged diameter portion are made of the same material, and may include copper base metals such as pure copper (oxygen free copper), 194 alloy (copper alloy), phosphor bronze, german silver and brass, which are comparatively softer than iron base metals. Especially, pure copper (oxygen free copper) and 194 alloy (copper alloy) are preferred of these copper base metals.

The pin has a Vickers hardness that is reduced by thermal heat treatment of the pin.

The pin of this aspect of the invention has a Vickers hardness reduced by thermal treatment. Accordingly, there is no need of employing a pin having a low hardness from the beginning. Hence, the pin is produced by a normal method, having a Vickers hardness that is reduced by the later thermal treatment. Therefore, the pin is easily available, and is inexpensive.

The pin is preferably mechanically polished prior to the thermal treating step.

At the time when the pin is produced, the pin may have burrs or a sharp corner edge. Hence, the burrs are removed by mechanical polishing such as by barrel polishing, or the sharp corner edge is beveled. Such mechanical polishing may be performed before or after thermal treatment of the pin. However, if such mechanical polishing is performed, the pin surface may be hardened due to collision of the media or abrasive grains with the surface of the pin. Accordingly, mechanical polishing after thermal treatment is undesirable, because the pin once softened is hardened again.

On the contrary, if the pin is mechanically polished prior to thermal treatment as described above, the pin can be softened by thermal treatment even though the pin may be hardened by mechanical polishing. Hence, it is possible to eliminate any influence of the mechanical polishing.

Of mechanical polishing techniques, barrel polishing is preferable. With barrel polishing, a large quantity of pins can be processed at a time and inexpensively, and uniformly in removing burrs or beveling.

Further, the pin has an enlarged diameter portion that contains a spherical surface opposite the side of a rod-like portion.

Therefore, if the pin standing substrate including the pin of this aspect of the invention is produced, the pin standing substrate is likely to absorb stress at a junction part between the pin and the substrate, when stress is applied to the pin. Hence, the stress applied to the pin itself or the substrate itself can be relieved. Also, it is possible to carry a larger amount of solder between the enlarged diameter portion of the pin containing the spherical surface and the pin-pad, resulting in increased bonding strength.

Accordingly, if a pin standing substrate including the pin of this invention is produced, the pin standing resin substrate is unlikely to break down in a junction part between the pin and pin pad on the resin substrate or in the part around the pin pad on the resin substrate when subjected to stress, and is highly reliable, due to a synergetic effect in that the pin is thermally treated at a high temperature and softened.

According to another aspect, the invention provides a method for making a pin for use in a pin standing substrate having at least one pin as an input/output terminal standing thereon, including:

a thermal treatment step of thermally treating and softening a pin by heating, the pin comprises a rod-like portion made of a copper base metal and an enlarged diameter portion made of the same material as the rod-like portion, the enlarged diameter portion having a larger diameter than the rod-like portion and being formed at one end of the rod-like portion.

In this aspect of the invention, the pin is subjected to thermal heat treatment and softened. Accordingly, if a pin standing substrate including the pin of this aspect of the invention is produced, the pin itself is prone to absorb stress, when stress is applied to the pin. Hence, the stress applied to the junction part between the pin and the substrate or the substrate itself can be relieved.

Hence, if a pin standing substrate is produced using the pin of this invention produced by this method of making, the pin standing resin substrate is unlikely to break down in a junction part between the pin and pin pad on the resin substrate or in the part around the pin pad on the resin substrate when stress is applied to the pin, and is highly reliable.

According to a further aspect, the invention provides a method for making a pin for use in a pin standing substrate having at least one pin as an input/output terminal standing thereon, including:

a thermal treatment step of thermally treating a pin by heating at a temperature of 500° C. or higher, the pin comprises a rod-like portion made of a copper base metal and an enlarged diameter portion made of the same material as the rod-like portion, the enlarged diameter portion having a larger diameter than the rod-like portion and being formed at one end of the rod-like portion.

In this aspect of the invention, the pin is subjected to thermal treatment by heating at a temperature of 500° C. or higher. Hence, the pin is made softer as a result of thermal heat treatment as compared to before thermal treatment.

Accordingly, if a pin standing substrate including this pin is produced, the pin itself absorbs stress, when stress is applied to the pin. As a result, the stress applied to a junction part between the pin and the resin substrate or the resin substrate itself can be relieved.

Accordingly, if a pin standing resin substrate is produced using the pin manufactured by this method of making, the pin standing resin substrate is unlikely to break down in a junction part between the pin and pin pad on the resin substrate or in the part around the pin pad when stress is applied to the pin, and is highly reliable.

According to another aspect, the invention provides a method for making a pin for use in a pin standing substrate having at least one pin as a input/output terminal standing thereon, including:

a thermal treatment step of thermally treating a pin by heating at a temperature of from 500° C. to 900° C., the pin comprises a rod-like portion and an enlarged diameter portion made of the same material as the rod-like portion, the enlarged diameter portion having a larger diameter than the rod-like portion and being formed at one end of the rod-like portion.

In this aspect of the invention, the pin is subjected to thermal treatment by heating at a temperature of from 500° C. to 900° C. Hence, the pin is made softer as a result of thermal heat treatment as compared to before the thermal treatment.

Accordingly, if a pin standing substrate including this pin is produced, the pin itself absorbs stress, when stress is applied to the pin. As a result, the stress applied to a junction part between the pin and the resin substrate or the resin substrate itself can be relieved.

Therefore, if a pin standing resin substrate is produced using the pin manufactured by this method of making, the pin standing resin substrate is unlikely to break down in a junction part between the pin and pin pad on the resin substrate or in the part around the pin pad when stress is applied to the pin, and is highly reliable.

According to a further aspect, the invention provides a method for making a pin for use in a pin standing substrate having at least one pin as an input/output terminal standing thereon, including:

a thermal treatment step of thermally treating a pin by heating at a temperature of 550° C. or higher, the pin comprises a rod-like portion made of a copper base metal and an enlarged diameter portion made of the same material as the rod-like portion, the enlarged diameter portion having a larger diameter than the rod-like portion and being formed at one end of the rod-like portion.

In this aspect of the invention, the pin made of a copper base metal is subjected to thermal treatment by heating at a temperature of 550° C. or higher. Hence, the pin made of a copper base metal is made softer as a result of thermal heat treatment as compared to before the thermal treatment.

Accordingly, if a pin standing substrate including this pin is produced, the pin itself absorbs stress, when stress is applied to the pin. As a result, the stress applied to a junction part between the pin and the resin substrate or the resin substrate itself can be relieved.

Therefore, if a pin standing resin substrate is produced using the pin manufactured by this method of making, the pin standing resin substrate is unlikely to break down in a junction part between the pin and pin pad on the resin substrate or in the part around the pin pad when stress is applied to the pin, and is highly reliable.

The thermal treatment of a pin made of a copper base metal may be appropriately chosen in a range of temperatures lower than the melting point. However, if the pin is heated to too high a temperature, the heating cost may be expensive, and it is preferable to heat the pin at a temperature of 900° C. or lower. Furthermore, in order to sufficiently soften a pin, it is preferable to heat the pin at a temperature of 550° C. or higher.

According to a further aspect, the invention provides a method for making a pin for use in a pin standing substrate having at least one pin as an input/output terminal standing thereon, including:

a pin hardness reducing step of reducing the Vickers hardness of a pin to 135 or less, the pin comprises a rod-like portion made of kovar or 42 alloy and has an enlarged diameter portion made of the same material as the rod-like portion, the enlarged diameter portion having a larger diameter than the rod-like portion and being formed at one end of the rod-like portion.

The Vickers hardness Hv of the pin made of a copper base metal is reduced preferably to 95 or less in a pin hardness reducing step. When stress is applied to the pin having a Vickers hardness Hv of 95 or less, the pin itself is deformed to absorb the stress more sufficiently, and is highly reliable. Furthermore, a pin having a Vickers hardness Hv of 60 or more is preferred.

The pin material may be any copper base metal, so long as the rod-like portion and the enlarged diameter portion are made of the same material, and may include copper base metals such as pure copper (oxygen free copper), 194 alloy (copper alloy), phosphor bronze, german silver and brass, which are comparatively softer than iron base metals. Specially, pure copper (oxygen free copper) and 194 alloy (copper alloy) are preferred in these copper base metals.

The method of making the pin according to this aspect of the invention includes reducing the Vickers hardness of the pin. Accordingly, there is no need to employ a pin having a low hardness from the beginning. Hence, a hard pin is produced by a normal method or is obtained from an outside source, and the Vickers hardness is reduced by the later step. Therefore, the pin is easily available or can be easily produced. As a result, a soft pin can be produced inexpensively.

Further, the method for making the pin may include a pin hardness reducing step that is the thermal heat treatment step of heating the pin to reduce its Vickers hardness.

Further, the method of making the pin preferably involves a thermal treatment step of passing the pin through a belt furnace. With thermal treatment within the belt furnace, the whole of the pin can be thermally treated uniformly and securely, and processed inexpensively, resulting in less expensive pins.

Further, in the case where the enlarged diameter portion of the pin contains a spherical surface opposite the side of the rod-like portion, the pin standing substrate including this pin can absorb stress at a junction part between the pin and the substrate, when stress is applied to the pin. As a result, the stress applied to the pin itself or the substrate itself can be relieved.

Also, it is possible to secure a quantity of solder between the enlarged diameter portion containing the spherical surface and the pin-pad.

Accordingly, if a pin standing substrate is produced using the pin manufactured by the above method of making, due to a synergetic effect of pin softening, it is possible to produce a pin standing resin substrate that is unlikely to break down even though stress is applied to the pin.

Further, the method for making the pin further preferably includes a mechanical polishing step of mechanically polishing the pin prior to the thermal treatment step.

At the time when the pin is produced by a press, the pin may have burrs in various parts, or a sharp corner edge is formed. Such burrs or sharp corner edges are easily exfoliated, and become a metal powder which sticks to various parts of the substrate or other electronic parts, bringing about a danger of causing a short-circuit or insulation failure. Hence, the burrs are removed by mechanical polishing such as barrel polishing, or the sharp corner edge is beveled. Such mechanical polishing may be performed before or after the thermal treatment of the pin.

However, if such mechanical polishing is performed, the pin surface may be hardened due to collision of the media or abrasive grains with the surface of pin. Accordingly, if the pin is mechanically polished after thermal treatment to soften the pin, the pin once softened is unfavorably hardened again.

On the contrary, if the pin is mechanically polished prior to thermal treatment, the pin can be softened by the thermal treatment although the pin is hardened by mechanical polishing. Therefore, a soft pin can be produced by eliminating any influence of the mechanical polishing.

In particular, the making method of the pin preferably includes a mechanical polishing step that comprises barrel polishing.

In this aspect of the invention, the mechanical polishing step is barrel polishing. With barrel polishing, a large quantity of pins can be processed at a time and inexpensively, and uniformly in removing burrs or beveling.

DESCRIPTION OF THE PREFERRED EMBODIMENTS

The invention is further described by the drawings. However, the invention should not be construed as being limited thereto.

Embodiment 1

Embodiment 1 will be described below with reference to the drawings.

FIG. 1 shows a pin 1 of this embodiment. This pin 1 is made of 194 alloy, and is formed with a Ni plated layer having a thickness of about 3.34 $\mu$m on its surface and an Au plated layer having a thickness of about 0.35 $\mu$m thereon (not shown). The pin 1 is constituted of a rod-like portion 1A (shaft portion) and an enlarged diameter portion 1B formed at one end. The rod-like portion 1A has a diameter of about 0.45 mm and a height (axial length) of 3.01 mm, and is almost cylindrical. On the other hand, the enlarged diameter portion 1B (flange) has a shape including a spherical surface in a direction opposite the side of the rod-like portion 1A, more specifically, a hemispherical shape swelling in an opposite direction to the side of the rod-like portion 1A. The maximum diameter of the enlarged diameter portion 1B is roughly 1.1 mm, its height (axial length) is 0.34 mm.

Also, this pin 1 is thermally treated, or heated up to a temperature of from 500° C. to 900° C. and then cooled slowly.

Since pin 1 has an enlarged diameter portion 1B of hemispherical shape, a pin standing substrate including this enlarged diameter portion 1B (spherical surface) soldered thereto is likely to absorb stress applied to a junction part between pin 1 and the substrate, when stress is applied to the pin 1. Therefore, the pin 1 itself or the substrate itself has less stress applied thereon.

Also, since pin 1 and the substrate can be bonded with a quantity of solder, the bonding strength can be increased.

Further, pin 1 is subjected to thermal heat treatment at a temperature of from 500° C. to 900° C. Hence, pin 1 is softer than a pin that has not been thermally treated. Therefore, if the pin standing substrate is produced using pin 1, the pin standing substrate can relieve stress applied to the junction part between pin 1 and the substrate or the substrate itself, because pin 1 is prone to absorb stress when applied thereto.

Accordingly, a pin standing substrate produced using this pin 1 is unlikely to break down in a junction part between the pin and pin pad on the resin substrate or in the part around the pin pad when stress is applied to the pin 1, and is highly reliable.

Figure 2:
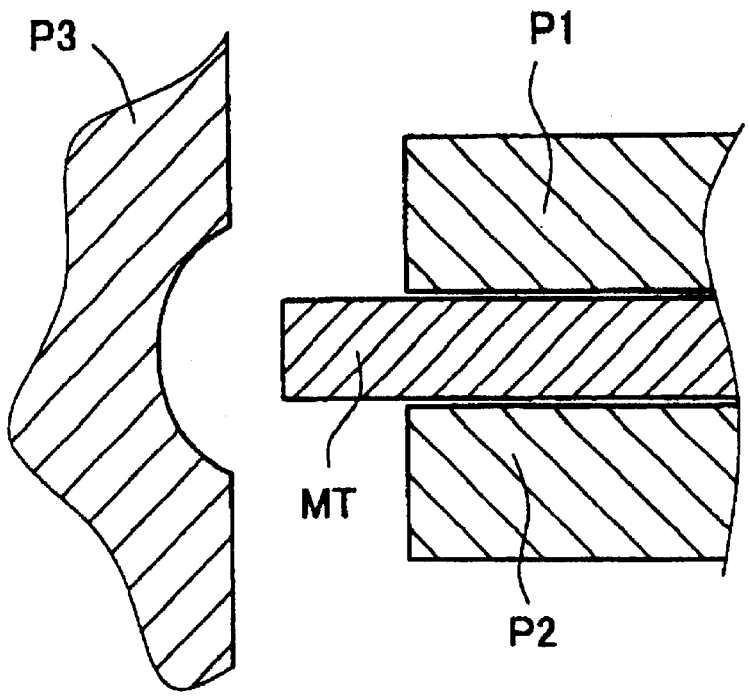
Figure 2:
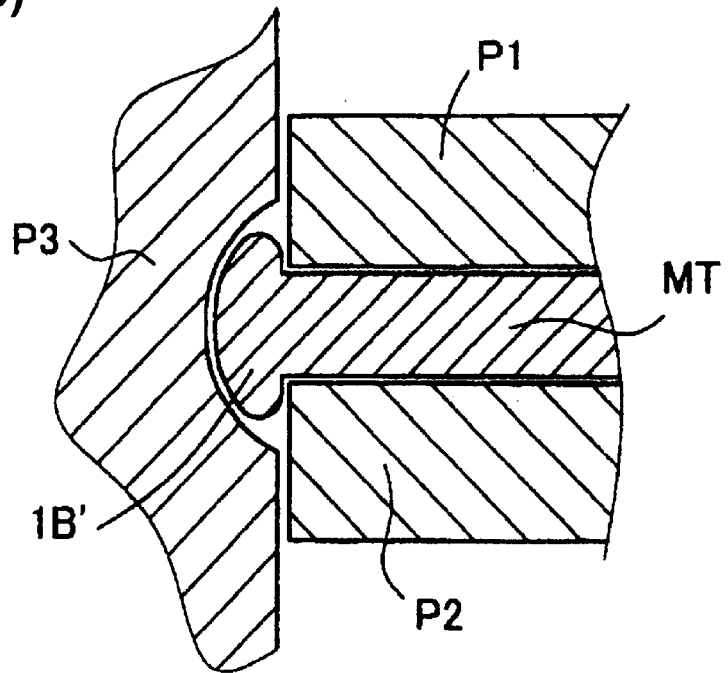
Figure 3:
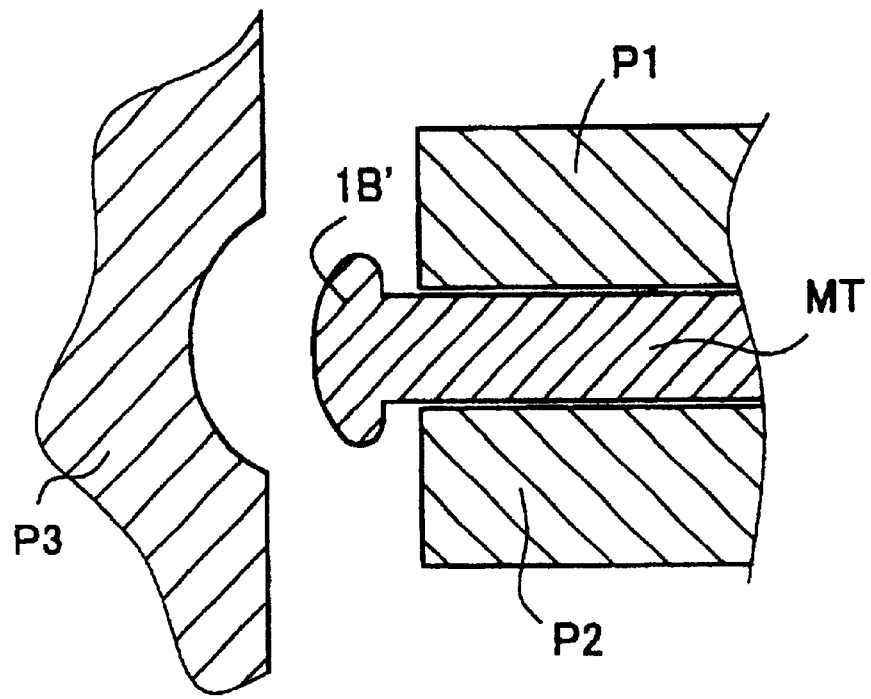
Figure 3:
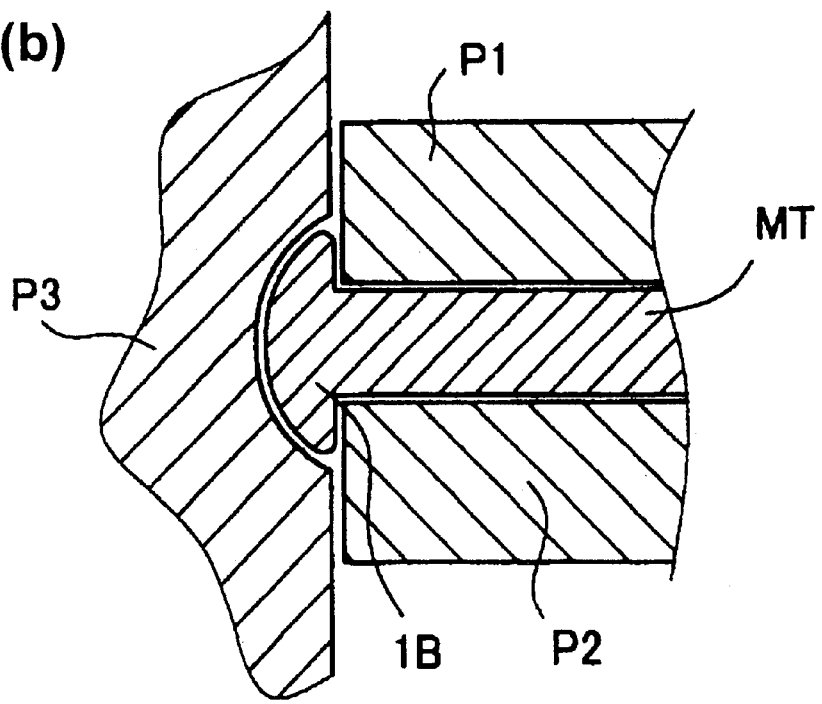
Figure 4:
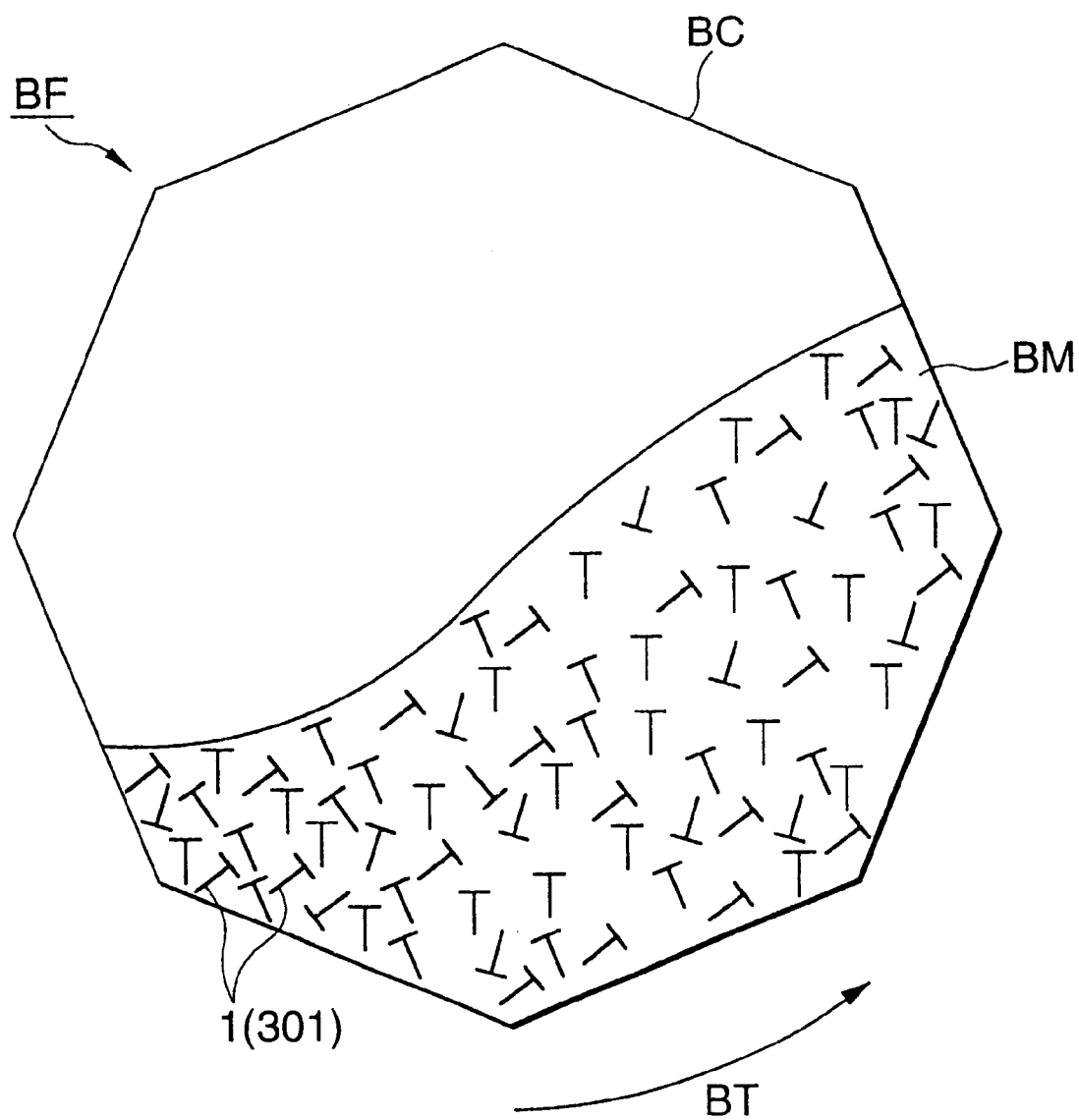
FIG. 4 is a schematic view illustrating a barrel-polishing step for barrel polishing the pin.

Referring now to FIGS. 2 to 4, a method for making pin 1 will be described below.

First, a wire rod MT made of 194 alloy (97 wt % or more of Cu, 2.1–2.6 wt % of Fe 0.03 wt % or less of Pb, 0.015–0.15 wt % of P, 0.05–0.20 wt % of Zn, and others), substantially circular in cross section, is prepared (see FIG. 2A). Then, in a first grasping step, the wire rod MT is grasped by the press dies P1, P2 so that a part of the wire rod MT may project therefrom, as shown in FIG. 2(a).

Then, in a first press step, the wire rod MT is pressed by the press dies P1, P2 and a press die P3 to form an enlarged diameter portion 1B' having a larger diameter than the wire rod MT and containing a spherical surface at its top end, as shown in FIG. 2(b).

In a second grasping step, the wire rod MT is grasped again by the press dies P1, P2 so that a part of the wire rod MT may further project, as shown in FIG. 3(a).

Then, in a second press step, the wire rod MT is pressed again to further make the enlarged diameter portion 1B', as shown in FIG. 3(b). Thereby, the enlarged diameter portion 1B of the pin 1 is formed. The enlarged diameter portion 1B having a height (axial length) can be formed by pressing the wire rod MT multiple times.

Then, in a cutting step, the wire rod MT is cut at a predetermined position to form the rod-like portion 1A substantially equivalent in diameter to the wire rod MT. After cutting the wire rod MT, pin 1 is subjected to a surface smoothing treatment by barrel polishing and chemical etching by a method well-known to those of ordinary skill to remove burrs or to bevel the sharp corner edge.

Specifically, in a barrel polishing step, a number of pins, together with media BM composed of alumina balls having a diameter of 3.0 to 5.0 mm, are placed into a rotational vessel BC, employing a well-known rotational barrel polishing machine BF, and rotated a few hours as indicated by the arrow BT, as shown in FIG. 4. Thereby, the burrs of pin 1 are removed, and the sharp corner edge is beveled. Since the media BM collides against pin 1 during barrel polishing, the surface of the pin 1 is hardened by work hardening.

Then, in a surface smoothing process of chemically etching pin 1 after barrel polishing, pin 1 is dipped into an acid solution to dissolve and partially remove the surface, so that the surface is made smooth. This surface smoothing process is favorable because it allows the media BM sticking to the pin 1 to be removed.

Then, in a thermal treatment step, the pin 1 is subjected to thermal treatment by heating at a temperature of 500° C. to 900° C. More specifically, pin 1 is heated to a maximum temperature of 634° C. at a temperature ramp-up rate of about 26° C. per minute, kept for five minutes or more in a heated state at a temperature of 600° C. or higher, and then slowly cooled at a temperature ramp-down rate of about 13° C. per minute in this embodiment.

Thereafter, in order to prevent oxidation of pin 1, pin 1 is plated with Ni on its surface, further plated with Au thereon in a thickness of 0.04 $\mu$m or greater (about 0.35 $\mu$m in this embodiment), thereby forming a Ni plated layer and an Au plated layer. In this way, pin 1 is completed.

With this method of making, pin 1 is heated to a temperature of from 500° C. to 900° C. and slowly cooled in the thermal treatment step. Hence, pin 1 becomes softer than before the thermal treatment. This is considered due to the fact that this thermal treatment can remove residual stress caused by work distortion in forming the wire rod MT from 194 alloy or work distortion in forming the enlarged diameter portion 1B of the pin 1 from the wire rod MT.

Since pin 1 is made softer, a pin standing substrate employing pin 1 can relieve stress applied to the junction part between the pin 1 and the substrate or the substrate itself, because the pin 1 itself is deformed to absorb the stress when stress is applied to the pin 1, as described below.

In particular, pin 1 has the burrs removed or is beveled in the barrel polishing step, and is then subjected to thermal treatment. Therefore, even if work hardening of the pin occurs due to the barrel polishing, the residual stress can be removed by thermal treatment. Hence, it is possible to eliminate any adverse influence of the barrel polishing. Accordingly, it is preferable to perform barrel polishing after thermal treatment, otherwise softened pin 1 is hardened again.

Since pin 1 manufactured by this method has the enlarged diameter portion 1B including a spherical surface, a pin standing substrate can relieve stress applied to the pin 1 itself or the substrate itself, by absorbing the stress over a junction part between pin 1 and the substrate, when stress is applied to pin 1. Therefore, pin 1 itself or the substrate itself has less stress applied thereto.

Also, since pin 1 and the substrate can be bonded with a quantity of solder, the bonding strength can be increased.

Therefore, if the pin standing substrate is produced using pin 1 manufactured by this method, the pin standing substrate is unlikely to break down in a junction part between the pin and pin pad on the resin substrate or in the part around the pin pad when stress is applied to pin 1, and is highly reliable.

Figure 5:
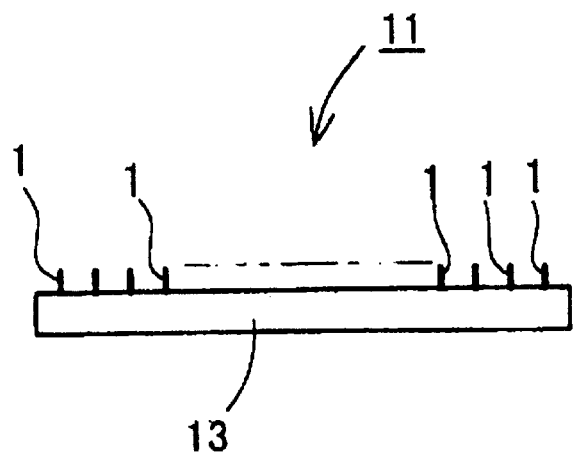
Figure 5:
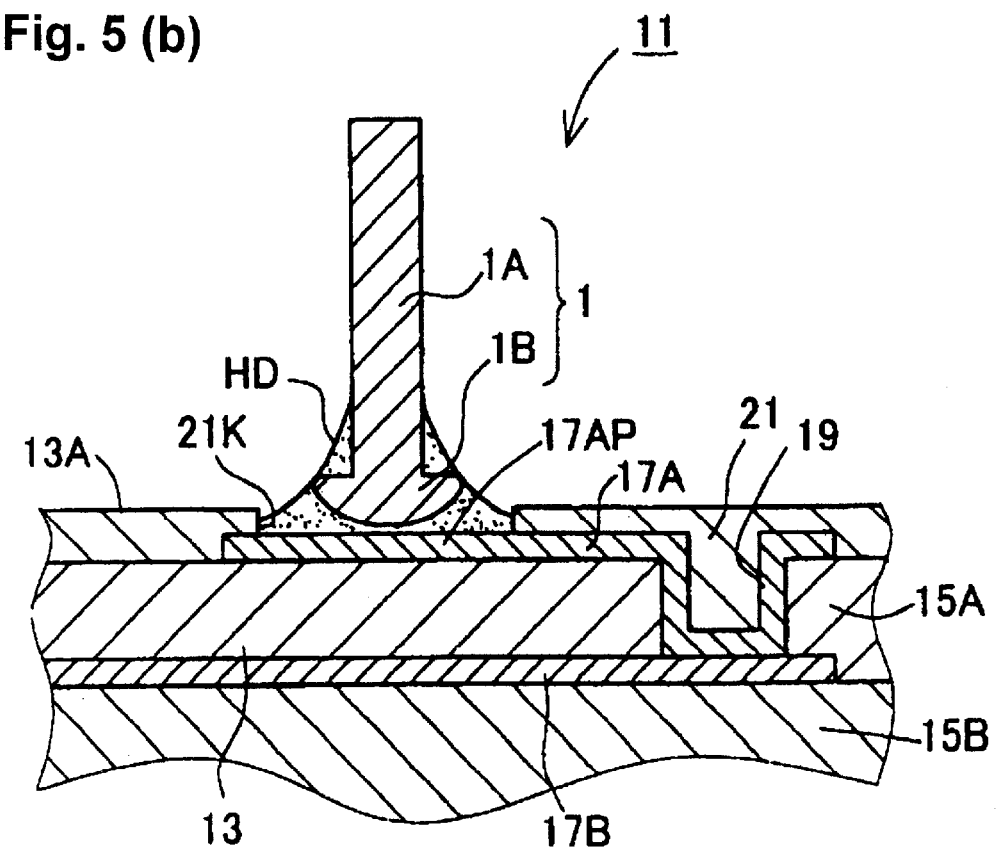

Referring now to FIG. 5, the pin standing resin substrate 11 of this embodiment will be described below. FIG. 5(a) is a side view of the pin standing resin substrate 11 and FIG. 5(b) is a partially enlarged cross-sectional view.

This pin standing resin substrate 11 comprises a resin substrate 13 having an almost rectangular, substantially laminar plate-shaped, and a number of pins 1 standing on the resin substrate 13.

The resin substrate 13 is a multi-layer wiring substrate made of resin having a plurality of resin insulating layers 15A, 15B made of epoxy resin and laminated, and a solder resist layer 21 made of epoxy resin.

The conductor layers 17A, 17B for the wiring or pad are formed between the resin insulating layers 15A, 15B and between a resin insulating layer 15A and a solder resist layer 21, respectively. Also, the resin insulating layers 15A, 15B are formed with a number of via conductors 19 or through hole conductors (not shown) for connecting the conductor layers 17A, 17B with each other.

The solder resist layer 21 constituting a main surface 13A of the resin substrate 13 has a number of openings 21K formed at predetermined positions. A pin-pad 17AP of the conductor layer 17 formed between the resin insulating layer 15A and the solder resist layer 21 is exposed within this opening 21K.

On the other hand, pin 1 is fixed to the resin substrate 13 by facing its enlarged diameter portion 1B (spherical surface) toward the pin-pad 17AP of the resin substrate 13, and bonding the entire enlarged diameter portion 1B and a part of the rod-like portion 1A on the side of the enlarged diameter portion 1B to the pin-pad 17AP by solder HD (Sn95%-Sb5%).

In this pin standing resin substrate 11, the pin 1 having an enlarged diameter portion 1B of substantially hemispherical shape is bonded by solder HD to the resin substrate 13, with the enlarged diameter portion 1B directed toward the pin-pad 17AP of the resin substrate 13. Therefore, when stress is applied to pin 1, the stress is prone to be absorbed over the junction part between the pin and the substrate. Hence, the stress applied to pin 1 itself or the resin substrate 13 itself can be relieved.

Also, since a quantity of solder HD is secured between the enlarged diameter portion 1B and the pin-pad 17AP, the bonding strength can be increased.

The pin 1 is heated to a temperature of from 500° C. to 900° C. and slowly cooled in the thermal treatment step. Hence, pin 1 becomes softer than before the thermal treatment. A pin standing substrate employing this pin 1 can relieve stress applied to the junction part between the pin 1 and the pin-pad 17AP or the resin substrate 13 itself, because the pin 1 itself is deformed to absorb the stress when stress is applied to the pin 1. Herein, slow cooling means that the pin is cooled slowly.

Accordingly, this pin standing resin substrate 11 is unlikely to break down in a junction part between the pin and pin pad on the resin substrate or in the part around the pin pad when subjected to stress, and is highly reliable, due to a synergetic effect thereof.

In particular, in this pin standing resin substrate 11, the pin 1 has the burrs removed or is beveled in the barrel polishing step, then subjected to thermal treatment, and fixed to the substrate. In other words, because use of the soft pin 1 is not affected by work hardening of the pin due to the barrel polishing, the pin standing resin substrate 11 is unlikely to break down in a junction part between the pin and pin pad on the resin substrate or in the part around the pin pad when stress is applied to the pin, and is highly reliable.

The relationship between the temperature of thermal treatment for the pin 1 and the bonding strength between pin 1 and the resin substrate 13 will be described below with reference to Table 1.

To examine the difference in bonding strength between pin 1 and the resin substrate 13 due to a difference in thermal treatment temperature for pin 1, the following investigation was made.

First, the first grasping step, the first press step, the second grasping step, the second press step, and the cutting step were performed as described above. Further, the barrel polishing step and the chemical etching step for the surface smoothing process were performed to form a number of pins 1 from the wire rod MT made of 194 alloy. In the pin thermal treatment step, pin 1 was then heated to 470° C., 550° C., 634° C., 740° C., 880° C., or 950° C. at maximum, and thereafter cooled slowly, so that six types of pins 1 with different thermal treatment temperatures were obtained. Then, an Ni—Au plated layer was formed on the surface 1 of each type of pin 1. In the pin fixing step for the method of making the pin standing resin substrate 11, each type of pin 1 was soldered to the resin substrate 13 to produce a pin standing resin substrate 11. Herein, for each type of pin 1 with the same thermal treatment temperature, five pin standing resin substrates 11, namely, a total of 6×5=30 pin standing resin substrates 11 were produced.

Then, for each pin standing resin substrate 11, a tensile test for the pin 1 was conducted. Specifically, the tensile test was performed by picking up and pulling in a direction angle of 30 degrees from the vertical line (the thickness direction of the resin substrate) any one of a number of pins standing on the pin standing resin substrate 11. If pin 1 was cut away in the rod-like portion 1A of the pin 1 without breaking at the junction part between pin 1 and the pin-pad 17AP, pin 1 was considered to pass, judging that the strength at the junction part was fully high. On the other hand, as a result of picking up and pulling pin 1, if pin 1 broke down at the junction part between pin 1 and the pin-pad 17AP, pin 1 was considered to fail, judging that the strength at the junction part was low.

For each pin standing resin substrate 11, the tensile test was conducted for ten pins 1. Accordingly, a total of 50 pins 1 subjected to the same thermal treatment temperature were tested.

Further, besides the pins 1 made of 194 alloy, pins 1 made of pure copper were evaluated in the same way.

The results are shown in Table 1 as below.

TABLE 1

| Number of samples: 50 pins each | | |
| --- | --- | --- |
| Treatment Temperature | Number of failing pins in tensile test | |
| (° C.) | 194 alloy pin | Pure copper pin |
| 470 | 3 | 5 |
| 550 | 1 | 2 |
| 634 | 0 | 0 |
| 740 | 0 | 0 |
| 880 | 0 | 0 |
| 950 | 0 | 0 |

As is apparent from Table 1, the 194 alloy pin 1 and the pure copper pin 1 had a decreasing number of failing pins (pin 1 broken between the pin 1 and the pin-pad 17AP) as the treatment temperature was raised. When the thermal treatment temperature was 634° C., 740° C., 880° C. or 950° C., the 194 alloy pin 1 and the pure copper pin 1 exhibited no failures. These results show that if the thermal treatment is performed at a temperature of at least 550° C. or higher, its effect appears to prevent the breakage between the pin 1 and the pin-pad 17AP. Further, if the thermal treatment is performed at a temperature of 634° C. or higher, there is almost no breakage between pin 1 and the pin-pad 17AP.

In the above investigation, the upper limit temperature was 950° C., because pin 1 itself will melt at too high a temperature.

From these results, if the thermal treatment temperature is 550° C. or higher, preferably 600° C. or higher, pin 1 becomes fully soft, resulting in increased bonding strength between pin 1 and the pin-pad 17AP. The thermal treatment temperature is preferably 900° C. or less in consideration of the melting point of the pin 1 and the cost for thermal treatment.

Then, for each pin standing resin substrate 11, a tensile test for pin 1 made of 194 alloy was conducted. Specifically, the tensile test was performed by picking up and pulling in the vertical direction (the thickness direction of the resin substrate) any one of a number of pins standing on the pin standing resin substrate 11. If pin 1 was cut away in the rod-like portion 1A of the pin 1 without breaking at the junction part between pin 1 and the pin-pad 17AP, the pin 1 was considered to pass, judging that the strength at the junction part was fully high. On the other hand, as a result of picking up and pulling pin 1, if pin 1 broke down at the junction part between pin 1 and the pin-pad 17AP, pin 1 was considered to fail, judging that the strength at the junction part was low.

For each pin standing resin substrate 11, the tensile test was conducted for ten pins 1. Accordingly, a total of 50 pins 1 with the same thermal treatment temperature were tested.

These results are shown in Table 2 below.

TABLE 2

Number of samples: 50 pins each

| Treatment Temperature (° C.) | Number of failing pins in tensile test 194 alloy pin |
|---|---|
| 25 | 25 |
| 300 | 23 |
| 350 | 18 |
| 400 | 10 |
| 450 | 10 |
| 500 | 0 |
| 550 | 0 |
| 600 | 0 |
| 650 | 0 |
| 700 | 0 |
| 750 | 0 |
| 800 | 0 |
| 850 | 0 |
| 900 | 0 |

As seen from Table 2, the 194 alloy pin 1 and the pure copper pin 1 had a decreasing number of failing pins (pin 1 broken at the junction part between the pin 1 and the pin-pad 17AP or in a part around the pin pad) as the treatment temperature was raised. When the thermal treatment temperature was 500° or higher, the 194 alloy pin 1 and the pure copper pin 1 had no failing pins. These results show that if the thermal treatment is performed at a temperature of at least 500° C. or higher, breakage between the pin 1 and the pin-pad 17AP is apparently prevented.

In the above investigation, the upper limit temperature was 900° C., because heating at higher temperature becomes expensive.

The above test shows that if the thermal treatment is performed at a temperature of 500° C. or higher, there is no breakage between pin 1 and the pin-pad 17AP, and that softening a pin is helpful for avoiding breakage between the pin 1 and the pin-pad 17AP.

Figure 6:
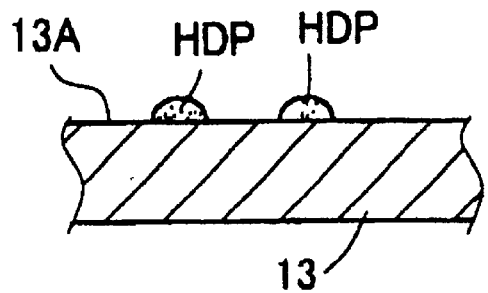
Figure 6:
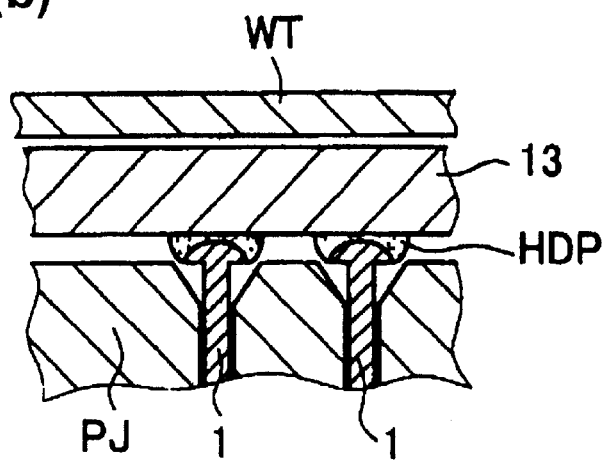
Figure 6:
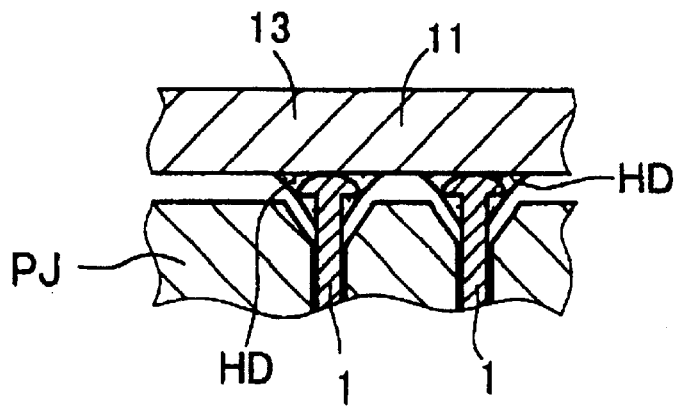

Referring now to FIG. 6, a method for making the pin standing resin substrate 11 will be described below.

First, pin 1 having the rod-like portion 1A made of 194 alloy and the enlarged diameter portion 1B is prepared. Specifically, the first grasping step, the first press step, the second grasping step, the second press step and the cutting step are performed, as previously described. Further, prior to the pin thermal treatment step, the barrel polishing step and the chemical etching step for the surface smoothing process are performed to form pins from the 194 alloy wire rod MT.

Then, in a pin thermal treatment step, pin 1 is subjected to thermal heat treatment at a temperature of from 500° C. to 900° C. More specifically, pin 1 is heated to a maximum temperature of 634° C. at a temperature ramp-up rate of about 26° C. per minute, kept for five minutes or more in a heated state at 600° C. or higher, and then slowly cooled at a temperature ramp-down rate of about 13° C. per minute in this embodiment. Consequently, pin 1 becomes rid of work distortion due to the press or barrel polishing, and becomes fully soft.

Thereafter, in order to prevent oxidation of pin 1, the pin 1 is plated with Ni in a thickness of about 3.34 μm on its surface, and further plated with Au in a thickness of about 0.35 μm or greater.

Then, the resin substrate 13 is prepared. This resin substrate 13 may have a resin insulating layer 15 and a conductor layer 17 formed alternately by a well-known method, followed by formation of a solder resist layer 21. In a solder printing step, a predetermined amount of solder paste HDP (Sn 95%, Sb 5%) is printed on the pin-pad 17AP of the resin substrate 13, as shown in FIG. 6(a).

Then, in a pin setting step, the pins 1 are set up on a pinning jig PJ, and the resin substrate 13 printed with the solder paste HDP in alignment to bring the enlarged diameter portion 1B of the pin 1 into contact with the soldering paste HDP on the pin-pad 17AP, as shown in FIG. 6(b). A weight WT is placed thereon to press the resin substrate 13.

In a reflow step, the resin substrate 13 placed on the pinning jig PJ is laid within a reflow furnace to melt the solder paste HDP, as shown in FIG. 6(c), to solder the enlarged diameter portion 1B of the pin 1 to the pin-pad 17AP, thereby completing the pin standing resin substrate 11. In this embodiment, the solder printing step, the pin setting step, and the reflow step correspond to the pin fixing step.

In this method of making, pin 1 is subjected to the thermal treatment by heating at a temperature from 500° C. to 900° C. and then slowly cooled. Hence, pin 1 becomes softer than before the thermal treatment. Accordingly, the pin standing resin substrate 11 thus produced can relieve stress applied to the junction part between the pin 1 and the resin substrate 13 or the resin substrate 13 itself, because pin 1 itself is prone to absorb stress when applied to the pin 1.

Also, in this method of making, since the enlarged diameter portion 1B containing the spherical surface is brought into contact with the pin-pad 17AP and soldered, the produced pin standing resin substrate 11 thus produced can absorb stress applied to the junction part between the pin and the resin substrate 13 and relieve stress applied to the pin 1 itself or the resin substrate 13 itself, when stress is applied to the pin 1.

Between the enlarged diameter portion 1B of the pin 1 and the pin-pad 17AP, a quantity of solder can be secured. Hence, the strength at the junction part can be increased.

Accordingly, with this method of making, the pin standing resin substrate 11 is unlikely to break down even though stress is applied to pin 1, and is highly reliable.

Figure 7:
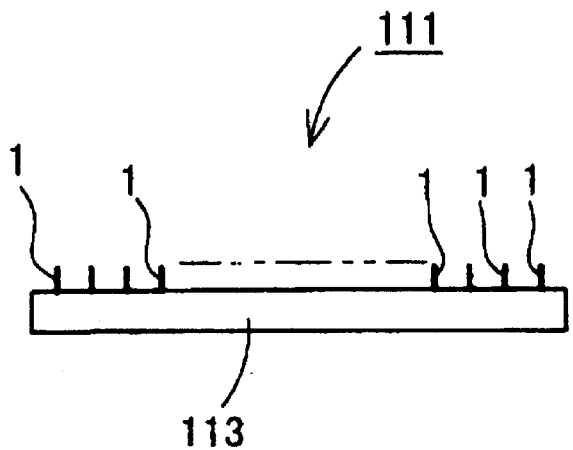
Figure 7:
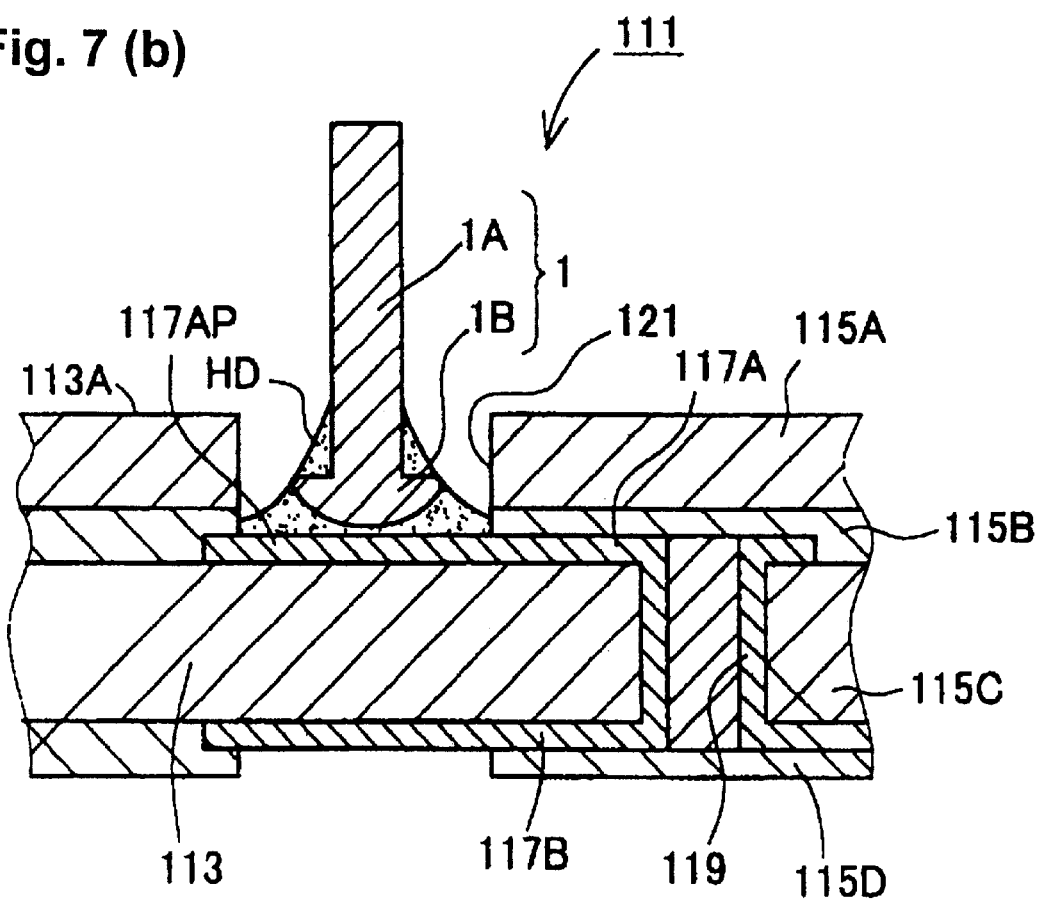

Embodiment 2:

Referring now to FIG. 7, the description of like parts as in embodiment 1 are not repeated or only simply described.

Pin 1 of embodiment 2 is the same as pin 1 of embodiment 1, except that it is made of pure copper (oxygen free copper), and the method of making is also the same (see FIGS. 1 to 4).

In a pin standing resin substrate 111, resin substrate 113 is different from resin substrate 13 of embodiment 1, as shown in FIG. 7. FIG. 7(a) is a side view of the pin standing resin substrate 111, and FIG. 7(b) is a partially enlarged cross-sectional view.

Pin standing resin substrate 111 comprises the resin substrate 113 having an almost rectangular, substantially laminar (plate-like) shape, and a number of pins 1 standing on the resin substrate 113.

The resin substrate 113 is a multi-layer wiring substrate made of resin having a plurality of resin insulating layers 115A, 115B, 115C and 115D made of epoxy resin and laminated.

The conductor layers 117A, 117B for the wiring or pad are formed between the resin insulating layers 115B, 115C and between the resin insulating layer 115A and 115D, respectively. Also, a resin insulating layer 115C is formed with a number of through hole conductors 119 for connecting the conductor layers 117A, 117B with each other.

On a main surface 113A of the resin substrate 113, a number of concave portions 121 passing through two resin insulating layers 115A, 115B on the side of the main surface 113A are formed at predetermined positions. A pin-pad 117AP of the conductor layer 117A is exposed from the bottom of the concave portion 121.

On the other hand, pin 1 is fixed onto the resin substrate 113 by facing its enlarged diameter portion 1B (spherical surface) toward the pin-pad 117AP exposed from the bottom of the concave portion 121, and bonding the entire enlarged diameter portion 1B and a part of the rod-like portion 1A on the side of the enlarged diameter portion 1B to the pin-pad 117AP by solder HD.

The whole of the enlarged diameter portion 1B and a part of the rod-like portion 1A in the pin 1 are accommodated within the concave portion 121. The solder HD for bonding the pin 1 and the pin-pad 117AP is substantially completely received within the concave portion 121.

In this pin standing resin substrate 111, the pin 1 having the enlarged diameter portion 1B of substantially hemispherical shape is bonded by solder HD to the resin substrate 113, with the enlarged diameter portion 1B directed toward the pin-pad 117AP of the resin substrate 113. Therefore, when stress is applied to the pin 1, the stress is prone to be absorbed over the junction part between the pin and the substrate. Hence, the stress applied to the pin 1 itself or the resin substrate 111 itself can be relieved.

Also, since a quantity of solder HD is secured in the junction part between the pin 1 and the pin-pad 117AP, the bonding strength can be increased.

Pin 1 is heated to a temperature of from 500° C. to 900° C. and slowly cooled in the thermal treatment step. Hence, pin 1 becomes softer than before the thermal treatment. It is possible to relieve stress applied to the junction part between pin 1 and the resin substrate 113 or the resin substrate 13 itself, because pin 1 itself is deformed to absorb stress when applied to the pin 1.

Accordingly, this pin standing resin substrate 111 is unlikely to break down in a junction part between the pin and pin pad on the resin substrate or in the part around the pin pad when subjected to stress, and is highly reliable, due to a synergetic effect thereof.

Particularly, in this pin standing resin substrate 111, the concave portion 121 of pin pad 117AP is exposed from the bottom, and the enlarged diameter portion 1B of the pin 1 is accommodated within this concave portion 121. Accordingly, although pin 1 is formed with enlarged diameter portion 1B, there is a reduced gap between the pin standing resin substrate 111 and a socket when pin 1 is inserted into the socket.

A method of making the pin standing resin substrate 111 of embodiment 2 will be described below.

First, pin 1 made of pure copper (99.98 wt % or more of copper and others) and having rod-like portion 1A and enlarged diameter portion 1B is prepared in the same manner as in embodiment 1. In a pin thermal treatment step, pin 1 is heated to a temperature of from 500° C. to 900° C., and thereafter cooled slowly. After that, a Ni—Au plated layer is formed on the surface of pin 1.

Then, resin substrate 113 produced by a well-known method is prepared. In a solder ball charging step, a solder ball is charged into each concave portion 121 formed on the resin substrate 113, dissolved and fixed to the pin-pad 117AP.

In a pinning jig setting step, the pins 1 are set up on a pinning jig PJ, and placed in alignment on the resin substrate 113.

In a reflow step, the pinning jig PJ and the resin substrate 111 are laid within a reflow furnace to melt the solder again, to solder the enlarged diameter portion 1B of the pin 1 to the pin-pad 117AP, thereby completing the pin standing resin substrate 111. In this embodiment, the solder ball charging step, the pinning jig setting step, and the reflow step correspond to the pin fixing step.

In embodiment 2, pin 1 is subjected to thermal treatment by heating at a temperature of from 600° C. to 900° C. and slowly cooled. Hence, pin 1 becomes softer than before the thermal treatment. Accordingly, the pin standing resin substrate 111 thus produced can relieve stress applied to the junction part between pin 1 and the resin substrate 111 or the resin substrate 111 itself, because the pin 1 itself is prone to absorb the stress when applied to the pin 1.

Also, since the enlarged diameter portion 1B having the spherical surface is brought into contact with the pin-pad 117AP and soldered, the pin standing resin substrate 111 thus produced can absorb the stress over the junction part between pin 1 and the resin substrate 113 and relieve stress applied to pin 1 itself or resin substrate 113 itself, when stress is applied to pin 1.

Between the enlarged diameter portion 1B containing the spherical surface and the pin-pad 117AP, a quantity of solder HD can be secured. Hence, the bonding strength can be increased.

Hence, the pin standing resin substrate 111 can be produced which is unlikely to break down even though stress is applied to pin 1, and is highly reliable.

Embodiment 3:

Embodiment 3 will be described below. In the above embodiments 1 and 2, pin 1 is made of a copper base metal such as 194 alloy or pure copper (oxygen free copper), and erected and soldered on the resin substrate. In embodiment 3, pin 1 is also made of such a copper base metal. Also, in the above embodiments 1 and 2, pin 1 has an enlarged diameter portion 1B bulging in substantially hemispherical shape toward the side opposite the rod-like portion 1A. However, in embodiment 3, pin 1 has a so-called nailheaded shape having an almost circular enlarged diameter portion, and the sizes of the pin and the pin-pad are different. However, the other parts are the same as those of embodiments 1 and 2. Hence, only different parts are mainly described, and the same parts are not described or simply described here.

Figure 8:
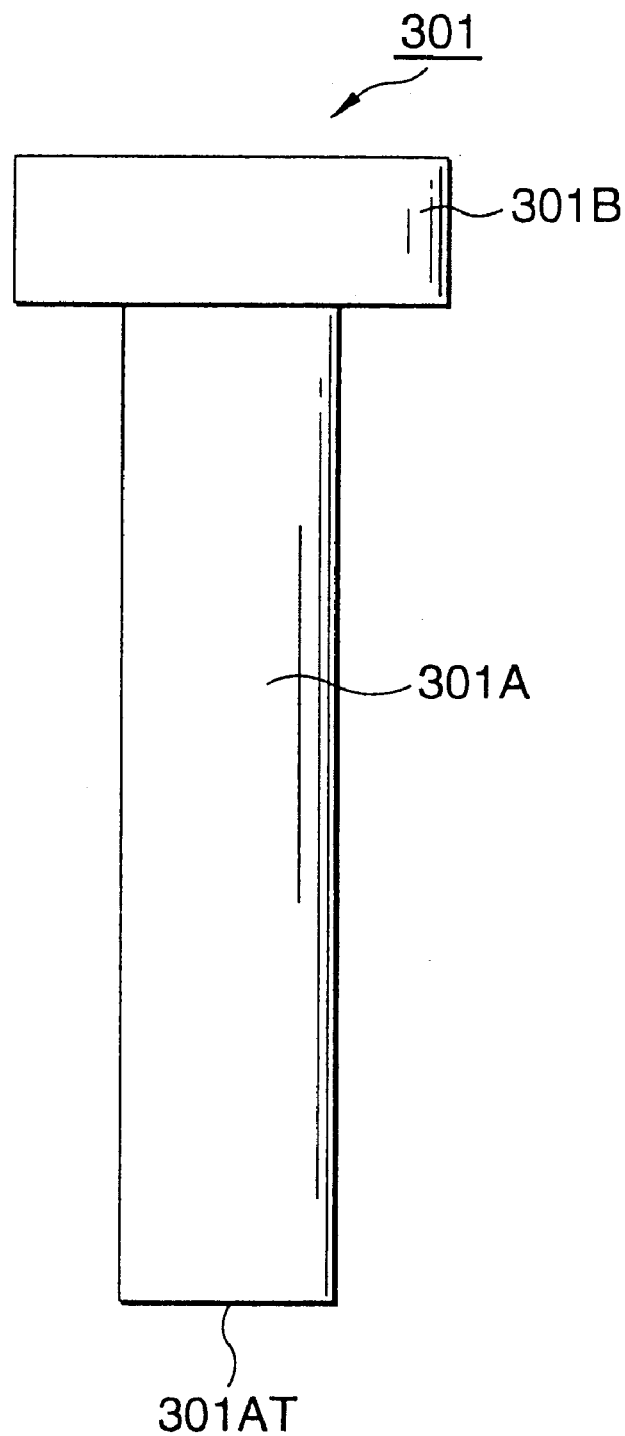
FIG. 8 is a side view illustrating the shape of a pin according to embodiment 3.

A pin 301 for use with embodiment 3 is made of 194 alloy, and comprises a rod-like portion 301A, an enlarged diameter portion 301B formed at one end (an upper end in FIG. 8) and a terminal portion 301AT at an opposite end. Pin 301 is smaller than pin 1 used in embodiments 1 and 2. The rod-like portion 301A has an almost cylindrical shape having a diameter of 0.31 mm and a height (axial length) of 1.83 mm. On the other hand, the enlarged diameter portion 301B has an almost circular shape having a diameter of 0.65 mm and a thickness of 0.20 mm, also called a nailhead.

Figure 9:
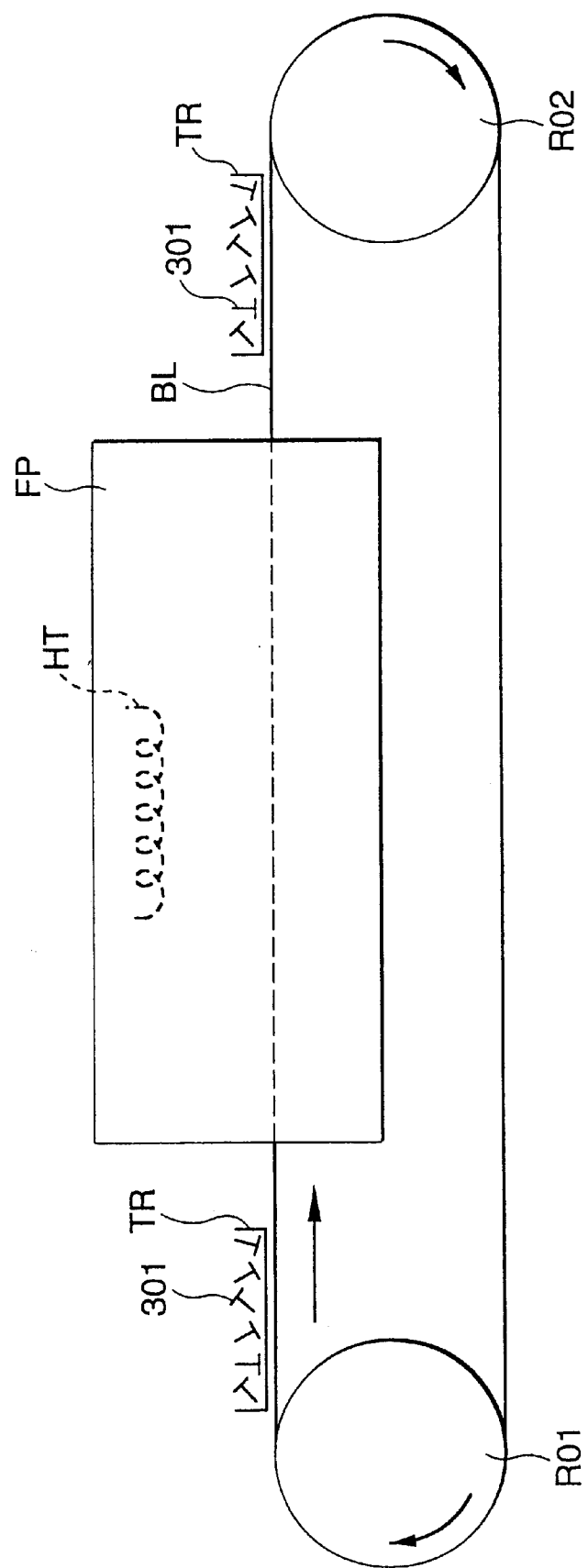
FIG. 9 is an explanatory view illustrating how the pin is thermally treated.

Pin 301 is produced by a well-known method to mold the enlarged diameter portion 301B with the press using a wire rod of 194 alloy. After molding pin 301, the pin 301 is subjected to barrel polishing (see FIG. 4) and chemical etching for the surface smoothing process. Further, in the thermal treatment step of the pin, a tray TR receiving pins 301 is laid on a belt BL looped between rollers RO1, RO2 and moving at a predetermined speed, and passed through a belt furnace FP with a predetermined temperature profile given by heater HT to effect thermal treatment of heating and slow cooling, as shown in FIG. 9. Specifically, the pins 301 were heated to a maximum temperature of 792° C. at a belt speed of 150 mm/min, kept for four to five minutes in a heated state at a temperature of 780° C. or higher, and thereafter cooled slowly.

Thereby, pin 301 is softer than before the thermal treatment. In other words, the hardness is reduced. This is considered due to the fact that pin 301 is hardened as a result of work hardening in drawing the wire rod from the raw material of 194 alloy, work hardening in forming the enlarged diameter portion 301B, or work hardening due to barrel polishing, and then softened as a result of thermal treatment.

A pin standing resin substrate including erected pins 301 will be described below. This pin standing resin substrate 311 comprises a resin substrate 313 having an almost rectangular, substantially laminar (plate-like) shape, with a number of pins 301 thermally treated standing on one face (an upper face in FIG. 10) of the resin substrate 313. The resin substrate 313 is a multi-layer wiring substrate made of resin having a plurality of resin insulating layers 315A, 315B made of epoxy resin and laminated, and a solder resist layer 321 made of epoxy resin laid on the top surface.

The conductor layers 317A, 317B for the wiring or pad are formed between the resin insulating layers 315A, 315B and between a resin insulating layer 315A and a solder resist layer 321, respectively. Also, the resin insulating layers 315A, 315B are formed with a number of via conductors 319 or through hole conductors (not shown) for connecting the conductor layers 317A, 317B with each other.

The solder resist layer 321 constituting a main surface 313A of the resin substrate 313 has a number of openings 321K formed at predetermined positions. Each opening 321K has a diameter of 1.0 mm, and has a pin-pad 317AP constituting a part of the conductor layer 317A exposed therein.

Figure 10:
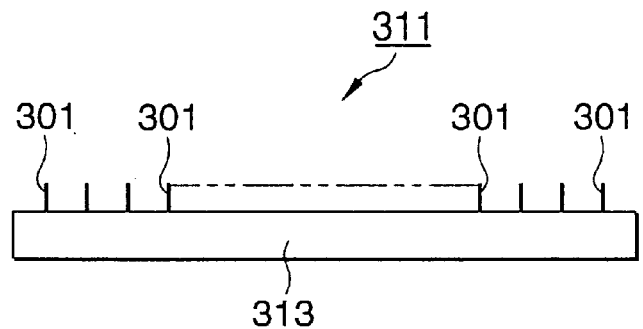
Figure 10:
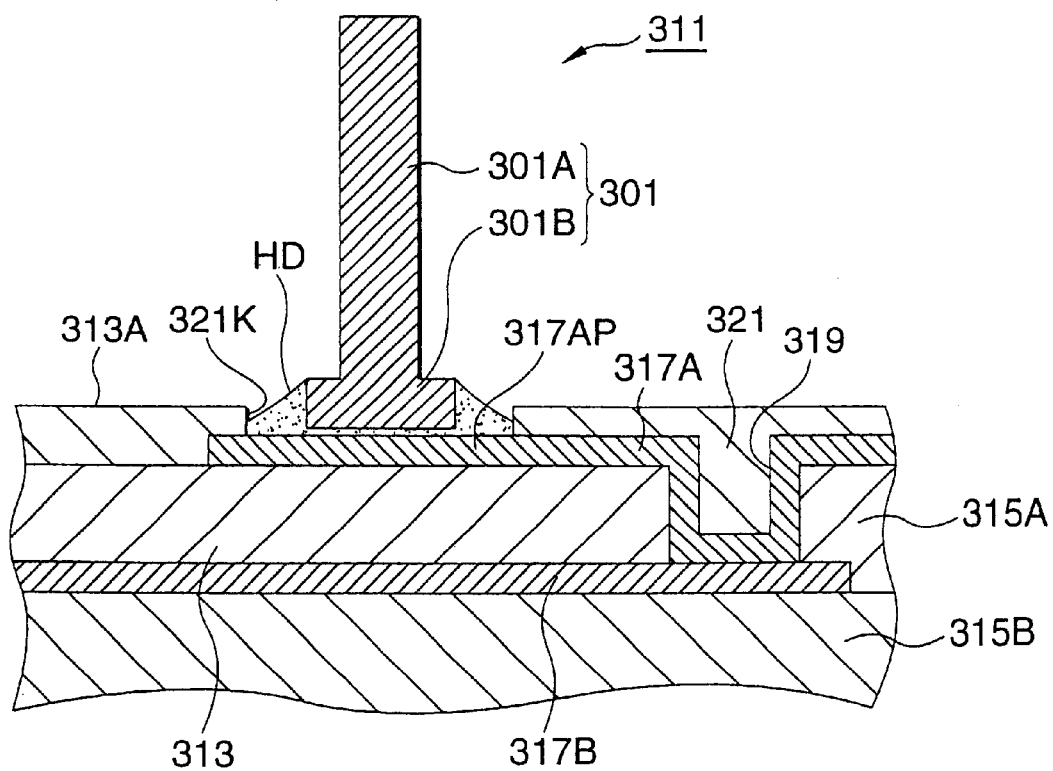

Pin 1 is fixed to the resin substrate 13 by facing its enlarged diameter portion 301B toward the pin-pad 317AP, and bonding an end face (a lower face in FIG. 10(*b*)) and the side faces of the enlarged diameter portion 301B to the pin-pad 301AP by solder HD.

On the face (an upper face in FIG. 10(*b*)) of the enlarged diameter portion 301B on the side of the rod-like portion, the solder HD is not spread by wetting, or somewhat spread by wetting.

In this pin standing resin substrate 311, the pin 1 is subjected to the thermal treatment at a high temperature, and is thus softer than the pin 301 not subjected to the thermal treatment, and hardened by work hardening. Therefore, when stress is applied to pin 301, pin 301 itself is deformed to absorb the stress. Hence, it is possible to relieve the stress applied to the junction part between the pin 301 and the pin-pad 317AP or the resin substrate 313 itself, and thereby prevent breakage of the junction part. Therefore, this pin standing resin substrate 311 is unlikely to break down in a junction part between the pin and pin pad on the resin substrate or in the part around the pin pad when the stress is applied to pin 301, and is highly reliable.

In this pin standing resin substrate 311, pin 301 has burrs removed or is beveled in the barrel polishing step, then subjected to thermal treatment, and fixed to the substrate. In other words, because the soft pin 1 not affected by work hardening of the pin due to the barrel polishing is used, the pin standing resin substrate 311 is unlikely to break down in a junction part between the pin and pin pad on the resin substrate or in the part around the pin pad when stress is applied to the pin, and is highly reliable.

The relationship between the temperature of thermal treatment for pin 301 made of 194 alloy, the hardness of the pin 301 (Vickers hardness Hv) and the bonding strength between the pin 301 and the resin substrate 313 will be described below.

To examine a difference in Vickers hardness Hv of pin 301 and the bonding strength between pin 301 and the resin substrate 313 due to a difference in thermal treatment temperature, the following investigation was made.

First, pins 301 were formed by a well-known method. Further, the barrel polishing step and the chemical etching step for the surface smoothing process were performed to form a number of pins 301 made of kovar.

Figure 11:
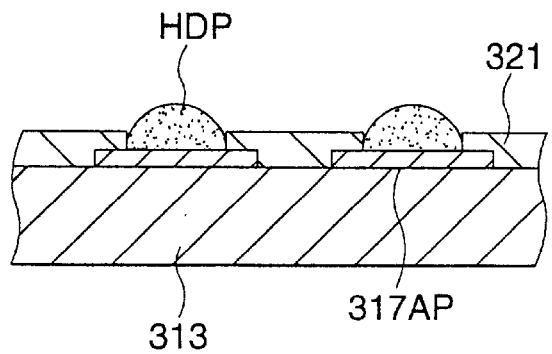
Figure 11:
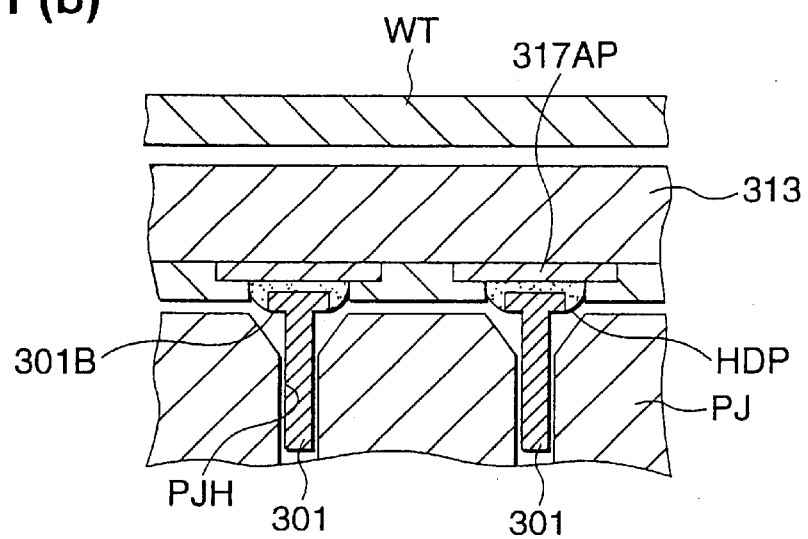
Figure 11:
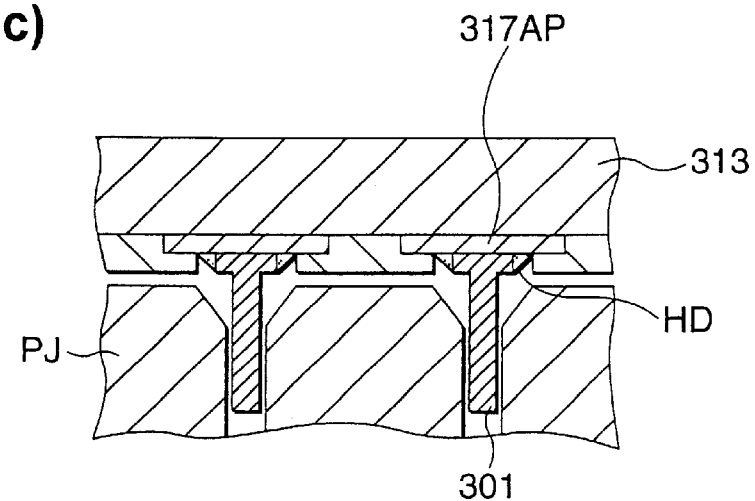
Figure 12:
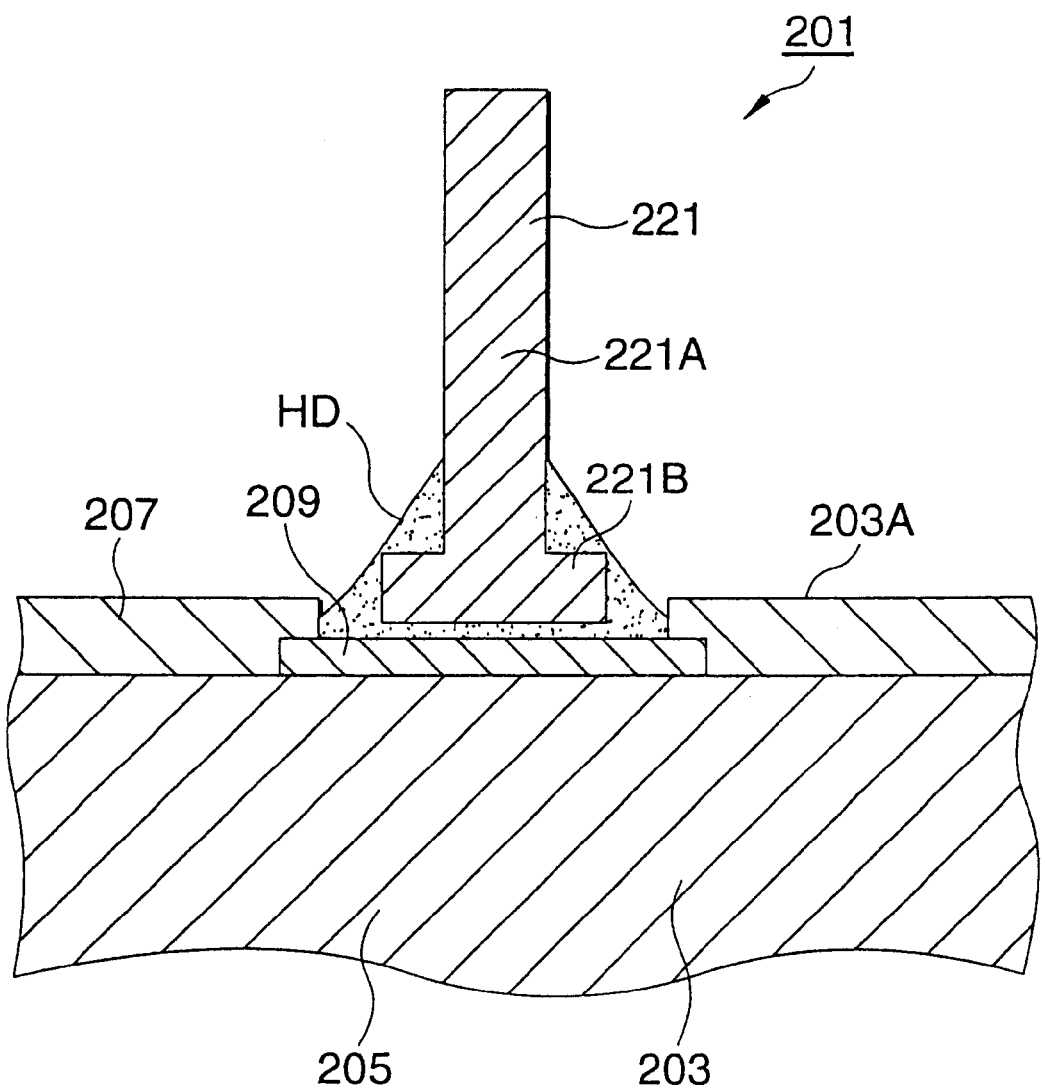
FIG. 12 is a partially enlarged cross-sectional view illustrating a conventional pin standing resin substrate.

The temperature profile of the belt furnace FP as shown in FIG. 9 was changed, and the feed speed of a belt BL was selected from two speeds (300 mm/min, 150 mm/min). In the pin thermal treatment step, pin 301 was heated to 350° C., 450° C., 500° C., 550° C., 600° C., 650° C., 700° C., 750° C., 800° C. 850° C. or 900° C. at maximum, besides 792° C., and thereafter cooled slowly, so that twelve types of pins 301 subjected to different thermal treatment temperatures including one type of pin maintained at room temperature (25° C.) without thermal treatment were obtained. For these twelve types of pins 301 (ten pins of each type), the Vickers hardness Hv was measured at the surface of the cross section in the middle of the pin length (see FIG. 8) by a micro Vickers measuring apparatus (MVK-E2 manufactured by AKASHI, the measuring conditions: load of 500 g, 15 seconds). The results are shown in Table 3 below. The relationship between the maximum temperature of thermal treatment and the average value of Vickers hardness is shown in FIG. 11.

TABLE 3

| Maximum Temp. (°) | Room Temp. | 350 | 450 | 500 | 550 | 600 | 650 | 700 | 750 |
|---|---|---|---|---|---|---|---|---|---|
| Maximum Value | 153 | 156 | 152 | 133 | 91.6 | 90.3 | 87.8 | 86.1 | 81.4 |
| Minimum Value | 150 | 142 | 142 | 110 | 80 | 85.5 | 85.1 | 83.9 | 79 |
| Average Value | 152 | 153.5 | 149.5 | 120.5 | 90.7 | 88.6 | 87.5 | 85.4 | 80.5 | n = 10 pcs

| Maximum Temp. (°) | 800 | 850 | 900 |
|---|---|---|---|
| Maximum Value | 78.5 | 77 | 73.7 |
| Minimum value | 74.6 | 74.1 | 67.8 |
| Average Value | 76.6 | 76.1 | 73.2 |

As seen from Table 3, pin 301 made of kovar had an average value of Vickers hardness as high as about 150, or pin 301 was stiff, in the case where thermal treatment was not carried out and the pin was maintained at room temperature (25° C.) or where thermal treatment was carried out at a maximum temperature of 450° C. or less. On the other hand, when the temperature of thermal treatment was increased to a maximum temperature of more than 500° C., the Vickers hardness Hv was suddenly lowered. For the pins subjected to the thermal treatment at a maximum temperature of 500° C. or more, the Vickers hardness Hv was 135 or less in terms of a maximum value. Particularly, for the pins subjected to thermal treatment at a maximum temperature of 550° C. or higher, that is, a maximum temperature of 550° C., 600° C., 650° C., 700° C., 750° C., 800° C., 850° C., or 900° C., or more specifically, the Vickers hardness Hv was 95 or less in terms of a maximum value. Thus, the pin is made softer as a result of thermal treatment. This is considered due to the fact that the pin is softened.

Thereafter, an Ni plated layer (2.7 to 3.3 $\mu$m) and an Au plated layer (0.28 to 0.39 $\mu$m) were formed on the surface of each type of pin 301. This Ni—Au plated layer allows the Vickers hardness Hv at the surface of the pin to be increased by about 10 to 20, depending on the thickness of the plated layer. However, the lower hardness due to the thermal treatment is apparent even in consideration of the increased hardness by plating.

Each type of pin 301 was soldered to the resin substrate 313 to produce a pin standing resin substrate 311. Herein, for each type of pin 301 under the same thermal treatment conditions, three pin standing resin substrates 311, namely, a total of 9×3=27 pin standing resin substrates 311, were produced.

As seen from the above results, a maximum temperature of thermal treatment at 500° C. or higher is preferred. Specially, a thermal treatment temperature of 550° C. or higher is preferred The pin standing resin substrate 311 of this embodiment can be made in the same way as in embodiments 1 and 2. That is, the pins 301 made of 194 alloy are produced, and subjected to barrel polishing step, the surface smoothing process step, and thermal treatment. Thereafter, pins 301 are plated with Ni and Au. Separately, the resin substrate 313 is prepared as shown in FIG. 14(a). In this figure, the resin substrate 313 is illustrated in simplified form. On resin substrate 313, resin insulating layer 313 and the conductor layer 317 may be formed alternately by a well-known method, and then solder resist layer 321 is formed (see FIG. 10).

Thereafter, pin 301 is fixed to the resin substrate 313. Specifically, a predetermined amount of soldering paste HDP (Sn 95%-Sb 5%, melting point 235 to 240° C.) is printed on the pin-pad 317AP of the resin substrate 313 in a solder printing step, as shown in FIG. 11(a).

In the setting step, pin 301 is set in a pin insertion hole PJH formed in the pinning jig PJ. Then, resin substrate 313 printed with soldering paste HDP is aligned thereon to bring the enlarged diameter portion 301B of pin 301 into contact with soldering paste HDP on the pin-pad 317 AP, as shown in FIG. 11(b). A weight WT is placed thereon to press the resin substrate 313.

Further, in a reflow step, the resin substrate 313 laid on the pinning jig PJ is introduced into the reflow furnace, and heated to a temperature as high as 260 to 265° C. to dissolve the soldering paste HDP, and to solder the enlarged diameter portion 301B of the pin 301 to the pin-pad 317AP, as shown in FIG. 11(c), whereby the pin standing resin substrate 311 is completed.

Thus, this invention has been described above in connection with embodiments 1, 2 and 3. However, this invention is not limited to the above embodiments, but may be appropriately changed without departing from the scope or spirit of the invention.

For example, in embodiments 1 and 2, the pin 1 has an enlarged diameter portion 1B of substantially rectangular shape. However, the enlarged diameter portion may have other shapes, e.g., an almost circular shape, as in embodiment 3. With a pin of such shape, the pin is thermally treated at a high temperature, and softened. Hence, the pin standing resin substrate 11, 111 is unlikely to break down in a junction part between the pin and pin pad on the resin substrate or in the part around the pin pad when stress is applied to the pin, and is highly reliable.

The enlarged diameter portion 1B may be comprised of, for example, a disk portion of almost circular shape formed at the end of the rod-like portion, and a hemispherical portion of roughly hemispherical shape made of silver solder and bulging from the disk portion in a direction opposite the side of the rod-like portion. With such an enlarged diameter portion 1B, the same effects can be obtained as described in embodiments 1 and 2.

Moreover, a pin made of kovar or 42 alloy as employed in embodiment 3 may be formed with an enlarged diameter portion of roughly hemispherical shape in the same manner as in embodiments 1 and 2.

In the above embodiments, Sn/Sb base solder is used as the solder HD. However, Pb/Sn base solder or Sn/Ag base solder may be employed.

This application is based on Japanese Patent Application Nos. 2000-108051 filed Apr. 10, 2000, 2000-313769 filed Oct. 13, 2000, 2001-9809 filed Jan. 18, 2001 and 2001-111881 filed Apr. 10, 2001, the disclosures of which are incorporated herein by reference in their entirety.

What is claimed is:

1. A pin standing resin substrate comprising:
    a resin substrate having a substantially plate-shaped main surface and comprising one of a resin and a composite material containing a resin, and having a pin-pad exposed from the main surface; and
    a pin soldered to the pin-pad,
    wherein the pin has been thermally treated by heating at a temperature of 500° C. or higher so as to soften the pin prior to soldering to the pin-pad, and comprises a rod comprising one of pure copper and 194 alloy and an enlarged diameter portion made of the same material as the rod, the enlarged diameter portion having a larger diameter than the rod and being formed at one end of the rod, and at least the enlarged diameter portion is soldered to the pin-pad.

2. The pin standing resin substrate according to claim 1, wherein the pin has been thermally treated by heating at a temperature of 500° C. or higher.

3. The pin standing resin substrate according to claim 1, wherein the pin has been thermally treated by heating at a temperature of 500 to 900° C.

4. The pin standing resin substrate according to claim 1, wherein the pin has been thermally treated by heating at a temperature of 550° C. or higher.

5. The pin standing resin substrate according to claim 1, wherein the pin has a Vickers hardness Hv of 135 or less.

6. The pin standing resin substrate according to claim 5, wherein the pin has been thermally treated by heating so as to reduce its Vickers hardness.

7. The pin standing resin substrate according to claim 1, wherein the enlarged diameter portion of the pin contains a spherical surface opposite the rod-like portion.

8. The pin standing resin substrate according to claim 1, wherein the main surface has a concave portion having a bottom portion at least on which the pin-pad is exposed, and at least the enlarged diameter portion is received by the concave portion and at least a part of the rod projects from the main surface.

9. A method of making a pin standing resin substrate, which comprises:

thermally treating a pin by heating at a temperature of 500° C. or higher so as to soften the pin, wherein the pin comprises a rod comprising one of pure copper and 194 alloy and an enlarged diameter portion made of the same material as the rod, the enlarged diameter portion having a larger diameter than the rod and being formed at one end of the rod; and soldering at least the enlarged diameter portion of the pin to a pin-pad so as to fix the pin with a resin substrate, wherein the resin substrate has a substantially plate-shaped main surface and comprises one of a resin and a composite material containing a resin, the pin-pad being exposed from the main surface.

10. The method of making a pin standing resin substrate according to claim 9, which comprises heating the pin at a temperature of 550° C. or higher.

11. The method of making a pin standing resin substrate according to claim 9, which comprises heating the pin at a temperature of 550° C. to 900° C.

12. The method of making a pin standing resin substrate according to claim 9, which comprises heating the pin at a temperature of 700° C. or higher.

13. A method of making a pin standing resin substrate, which comprises:

reducing the Vickers hardness (Hv) of a pin to 135 or less, wherein the pin comprises a rod and an enlarged diameter portion made of the same material comprising one of pure copper and 194 alloy, the pin having been thermally treated by heating at a temperature of 500° C. or higher, and the enlarged diameter portion having a larger diameter than the rod and being formed at one end of the rod; and soldering at least the enlarged diameter portion of the pin to a pin-pad so as to fix the pin with a resin substrate, wherein the resin substrate has a substantially plate-shaped main surface and comprises one of a resin and a composite material containing a resin, the pin-pad being exposed from the main surface.

14. The method of making a pin standing resin substrate according to claim 13, which comprises thermally treating the pin by heating to reduce its Vickers hardness.

15. The method of making a pin standing resin substrate according to claim 9, which further comprises mechanically polishing the pin prior to thermal treatment.

16. The method of making a pin standing resin substrate according to claim 14, which further comprises mechanically polishing the pin prior to thermal treatment.

17. A method of making a pin standing resin substrate, which comprises:

soldering a pin-pad with at least an enlarged diameter portion of a pin, so as to fix the pin to a resin substrate, wherein the resin substrate has a substantially plate-shaped main surface and comprises one of a resin and a composite material containing a resin, the pin-pad being exposed from the main surface, the pin having a Vickers hardness (Hv) of 135 or less, the pin having been thermally treated by heating at a temperature of 500° C. or higher, and the pin comprising a rod and an enlarged diameter portion made of the same material comprising one of pure copper and 194 alloy, the enlarged diameter portion having a larger diameter than the rod and being formed at one end of the rod.

18. A pin for use in a pin standing substrate having at least one pin as an input/output terminal standing thereon, which comprises:

a rod comprising one of pure copper and 194 alloy; and an enlarged diameter portion made of the same material as the rod, the enlarged diameter portion having a larger diameter than the rod and being formed at one end of the rod, wherein the pin has been thermally treated by heating at a temperature of 500° C. or higher so as to soften the pin.

19. The pin according to claim 18, which has been thermally treated by heating at a temperature of 550° C. or higher.

20. The pin according to claim 18, which has been thermally treated by heating at a temperature of 550° C. to 900° C.

21. The pin according to claim 18, wherein the pin has been thermally treated by heating at a temperature of 550° C. or higher.

22. The pin according to claim 18, wherein the pin has a Vickers hardness of 135 or less.

23. The pin according to claim 22, wherein the pin has been thermally treated by heating so as to reduce its Vickers hardness.

24. The pin according to claim 18, wherein the enlarged diameter portion of the pin contains a spherical surface opposite the rod.

25. A method of making a pin for use in a pin standing substrate having at least one pin as an input/output terminal standing thereon, which comprises:

thermally treating the pin by heating at a temperature 500° C. or higher so as to soften the pin, wherein the pin comprises a rod comprising one of pure copper and 194 alloy and an enlarged diameter portion made of the same material as the rod, the enlarged diameter portion having a larger diameter than the rod and being formed at one end of the rod.

26. The method according to claim 25, which comprises thermally treating the pin by heating at a temperature of 550° C. or higher.

27. The method according to claim 25, which comprises thermally treating the pin by heating at a temperature of 550° C. to 900° C.

28. The method according to claim 25, which comprises thermally treating the pin by heating at a temperature of 700° C. or higher.

29. The method according to claim 25, which comprises reducing the Vickers hardness of the pin to 135 or less.

30. The method according to claim 29, which comprises thermally treating the pin by heating at a temperature of 500° C. or higher so as to reduce its Vickers hardness to 135 or less.

31. The method according to claim 25, which further comprises mechanically polishing the pin prior to thermal treatment.

* * * * *